US010700253B2

(12) United States Patent
Dry et al.

(10) Patent No.: US 10,700,253 B2
(45) Date of Patent: Jun. 30, 2020

(54) CONDUCTIVE TAPE RECESS

(71) Applicant: Ford Global Technologies, LLC, Dearborn, MI (US)

(72) Inventors: Alan George Dry, Grosse Pointe Woods, MI (US); Johnathan Andrew Line, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 434 days.

(21) Appl. No.: 15/608,131

(22) Filed: May 30, 2017

(65) Prior Publication Data

US 2018/0345835 A1    Dec. 6, 2018

(51) Int. Cl.
| | | |
|---|---|---|
| *H01L 35/04* | (2006.01) | |
| *B60N 2/56* | (2006.01) | |
| *A47C 7/74* | (2006.01) | |
| *F25B 21/02* | (2006.01) | |

(52) U.S. Cl.
CPC ............ *H01L 35/04* (2013.01); *B60N 2/5621* (2013.01); *B60N 2/5692* (2013.01); *A47C 7/746* (2013.01); *F25B 21/02* (2013.01)

(58) Field of Classification Search
CPC ........ B60N 542/5657; B60N 542/5685; B60N 542/56; B60N 542/5607; B60N 542/5621; B60N 542/5635; B60N 542/565; B60N 542/5678; B60N 542/5692; A47C 7/44; A47C 7/746; A47C 7/748; A47C 7/74; A47C 7/742; C09J 9/02; C09J 7/22; C09J 7/35; G05D 23/1931; G05D 23/1932; G05D 23/1934; G05D 23/1951; F24B 21/02
See application file for complete search history.

(56) References Cited

U.S. PATENT DOCUMENTS

| | | |
|---|---|---|
| 3,648,469 A | 3/1972 | Chapman |
| 4,043,544 A | 8/1977 | Ismer |
| 4,626,664 A | 12/1986 | Grise |
| 4,656,339 A | 4/1987 | Grise |
| 5,597,200 A | 1/1997 | Gregory et al. |

(Continued)

FOREIGN PATENT DOCUMENTS

| | | |
|---|---|---|
| CN | 201890168 U | 7/2011 |
| CN | 203651539 U | 6/2014 |
| DE | 102013021199 A1 | 7/2014 |

OTHER PUBLICATIONS

U.S. Appl. No. 15/608,115, filed May 30, 2017, Hoang, Docketed New Case—Ready for Examination, Thermally Conductive Tape.

(Continued)

*Primary Examiner* — Shawntina T Fuqua

(74) *Attorney, Agent, or Firm* — David Coppiellie; Price Heneveld LLP

(57) ABSTRACT

A vehicle seating assembly comprises a cushion and a seating surface. A recess includes at least two branches defined in the cushion. The two branches come together at a junction and extend in a direction parallel with the seating surface. An elongate carrier is disposed between the recess and the seating surface, the elongate carrier includes a plurality of thermoelectric devices arranged along the recess. A flexible bellows extends through the cushion and has a first end in fluid communication with the junction and a second end in fluid communication with an air mover.

7 Claims, 20 Drawing Sheets

(56) References Cited

U.S. PATENT DOCUMENTS

| | | |
|---|---|---|
| 5,626,021 A | 5/1997 | Karunasiri et al. |
| 5,835,983 A | 11/1998 | McMahen et al. |
| 6,019,424 A | 2/2000 | Rueckert et al. |
| 6,079,485 A | 6/2000 | Esaki et al. |
| 6,100,463 A | 8/2000 | Ladd et al. |
| 6,119,463 A | 9/2000 | Bell |
| 6,291,803 B1 | 9/2001 | Fourrey |
| 6,786,541 B2 | 9/2004 | Haupt et al. |
| 7,114,771 B2 | 10/2006 | Lofy et al. |
| 7,178,344 B2 | 2/2007 | Bell |
| 7,320,357 B2 | 1/2008 | Pause |
| 7,475,464 B2 | 1/2009 | Lofy et al. |
| 7,637,569 B2 | 12/2009 | Krobok et al. |
| 7,640,754 B2 | 1/2010 | Wolas |
| 8,359,871 B2 | 1/2013 | Woods et al. |
| 8,702,164 B2 | 4/2014 | Lazanja et al. |
| 9,105,808 B2 | 8/2015 | Petrovski |
| 9,105,809 B2 | 8/2015 | Lofy |
| 9,272,647 B2 | 3/2016 | Gawade et al. |
| 9,310,112 B2 | 4/2016 | Bell et al. |
| 9,335,073 B2 | 5/2016 | Lofy |
| 9,366,461 B2 | 6/2016 | Bell et al. |
| 9,440,567 B2 | 9/2016 | Lazanja et al. |
| 9,560,907 B2 | 2/2017 | Bouix et al. |
| 9,676,310 B2 | 6/2017 | Fitzpatrick et al. |
| 2002/0092308 A1* | 7/2002 | Bell .................. B60H 1/00471 62/3.7 |
| 2003/0041379 A1 | 3/2003 | Habboub et al. |
| 2003/0102296 A1 | 6/2003 | Nelson et al. |
| 2003/0186642 A1 | 10/2003 | Aoki |
| 2004/0036326 A1 | 2/2004 | Bajic et al. |
| 2004/0139758 A1 | 7/2004 | Kamiya et al. |
| 2005/0066505 A1 | 3/2005 | Iqbal et al. |
| 2005/0140189 A1 | 6/2005 | Bajic et al. |
| 2005/0242081 A1 | 11/2005 | Howick |
| 2006/0087160 A1 | 4/2006 | Dong et al. |
| 2006/0130490 A1 | 6/2006 | Petrovski |
| 2006/0175877 A1 | 8/2006 | Alionte et al. |
| 2006/0208540 A1 | 9/2006 | Lofy et al. |
| 2006/0214480 A1 | 9/2006 | Terech |
| 2007/0040421 A1 | 2/2007 | Zuzga et al. |
| 2007/0095378 A1 | 5/2007 | Ito et al. |
| 2007/0101729 A1 | 5/2007 | Aoki et al. |
| 2007/0158981 A1 | 7/2007 | Almasi et al. |
| 2007/0176471 A1 | 8/2007 | Knoll |
| 2007/0234742 A1 | 10/2007 | Aoki et al. |
| 2008/0047598 A1 | 2/2008 | Lofy |
| 2008/0087316 A1 | 4/2008 | Inaba et al. |
| 2008/0142494 A1 | 6/2008 | Blake et al. |
| 2008/0173022 A1 | 7/2008 | Petrovski |
| 2009/0025770 A1 | 1/2009 | Lofy |
| 2009/0033130 A1 | 2/2009 | Marquette et al. |
| 2009/0179731 A1 | 7/2009 | Ihle et al. |
| 2010/0300644 A1 | 12/2010 | Chung |
| 2010/0301642 A1 | 12/2010 | Negrini et al. |
| 2010/0319744 A1 | 12/2010 | Smythe et al. |
| 2010/0327637 A1 | 12/2010 | Bajic et al. |
| 2011/0226751 A1 | 9/2011 | Lazanja et al. |
| 2011/0227389 A1 | 9/2011 | Gomes et al. |
| 2011/0240751 A1 | 10/2011 | Rauh et al. |
| 2012/0000901 A1 | 1/2012 | Bajic et al. |
| 2012/0228903 A1 | 9/2012 | Abe et al. |
| 2013/0068748 A1 | 3/2013 | Csonti et al. |
| 2013/0097777 A1 | 4/2013 | Marquette et al. |
| 2013/0146116 A1 | 6/2013 | Jovovic et al. |
| 2014/0152058 A1 | 6/2014 | Line et al. |
| 2015/0003493 A1 | 1/2015 | Bieck et al. |
| 2015/0048658 A1 | 2/2015 | Gawade et al. |
| 2015/0061331 A1 | 3/2015 | Yang |
| 2015/0069798 A1 | 3/2015 | Bajic et al. |
| 2015/0266405 A1 | 9/2015 | Fitzpatrick et al. |
| 2016/0009206 A1 | 1/2016 | Perraut et al. |
| 2016/0039321 A1 | 2/2016 | Dacosta-Mallet et al. |
| 2016/0128487 A1 | 5/2016 | Eskridge, III et al. |
| 2016/0332549 A1 | 11/2016 | Marquette et al. |
| 2017/0028886 A1 | 2/2017 | Zhang et al. |
| 2017/0144574 A1 | 5/2017 | Tanaka et al. |
| 2017/0305301 A1 | 10/2017 | McMillen et al. |
| 2018/0178692 A1 | 6/2018 | Zhao et al. |

OTHER PUBLICATIONS

U.S. Appl. No. 15/608,178, filed May 30, 2017, Walraed-Sullivan, Second Office Action dated Dec. 20, 2018, 2 Month Response Due Feb. 20, 2019, Conductive System.

U.S. Appl. No. 15/608,157, filed May 30, 2017, Hoang, Docketed New Case—Ready for Examination, Conductive System.

Elarusi, Abdulmunaem H., "Optimal Design of a Thermoelectric Cooling/Heating System for Car Seat Climate Control (CSCC)" 2016. Master's Theses. 720, Western Michigan University, ScholarWorks at WMU.

Lee, Dr. Hosung, "Optimal Design of a Thermoelectric Cooling/Heating for Car Seat Comfort." 2014.

* cited by examiner

CONDUCTIVE TAPE RECESS

FIELD OF THE DISCLOSURE

The present disclosure generally relates to a vehicle seating assembly, and more particularly to a vehicle seating assembly having a climate-controlled seat utilizing thermally conductive tape.

BACKGROUND OF THE DISCLOSURE

Vehicle seat comfort has become increasingly important as passengers take longer trips. Providing cooling and heating in the seat can increase the comfort of passengers.

A variety of vehicle seating assemblies that provide for occupant cooling and heating are known. However, current solutions for providing cooled and heated surfaces often can be too thick to conform to the contours of the substrates for which they are intended. Further, current solutions for providing cooled and heated surfaces can take extended periods of time to reach an occupant-perceptible temperature change.

SUMMARY OF THE DISCLOSURE

According to an aspect of the present disclosure, a vehicle seating assembly includes a cushion and a seating surface. The vehicle seating assembly also includes a recess including at least two branches defined in the cushion, the at least two branches coming together at a junction and extending in a direction parallel with the seating surface. The vehicle seating assembly includes an elongate carrier disposed between the recess and the seating surface, the elongate carrier including a plurality of thermoelectric devices arranged along the recess. A flexible bellows extends through the cushion and has a first end in fluid communication with the junction and a second end in fluid communication with an air mover.

Embodiments of the first aspect of the disclosure can include any one or a combination of the following features:

the at least two branches are arranged diagonally from a center of a seat to forward corners of the seat;

the at least two branches include two forwardly-extending branches and two rearwardly-extending branches;

the cushion is a seat cushion oriented horizontally and configured to move air proximate the seating surface;

the cushion is a seatback cushion oriented vertically and configured to move air proximate the seating surface;

the recess includes a film disposed therein;

the thermoelectric devices are configured to change temperature when a voltage is applied to the thermoelectric devices;

an upper conductor and a lower conductor, the upper conductor and the lower conductor being disposed on at least one of an upper and a lower surface of the elongate carrier, wherein the upper conductor and the lower conductor are in thermal contact with the thermoelectric devices;

the thermoelectric devices, the upper conductor, and the lower conductor are configured to draw heat away from the seating surface;

the thermoelectric devices, the upper conductor, and the lower conductor are configured to move heat toward the seating surface;

an air passageway formed between the elongate carrier and the recess wherein air in the air passageway draws heat from the seating surface;

an air passageway formed between the elongate carrier and the recess wherein air in the air passageway delivers heat toward the seating surface; and/or the recess has a first end and a second end the first end being coupled to the bellows and the second end being located at an edge of the cushion and being in communication with ambient air.

According to another aspect of the present disclosure, a seating assembly comprises a seat including a cushion and a seating surface. The seating assembly further comprises a recess defined in the seat and extending in a direction parallel with the seating surface. A conductive elongate tape is disposed between the recess and the seating surface. A bellows extends through the cushion and has a first end in fluid communication with the recess and a second end in fluid communication with an air mover.

Embodiments of the second aspect of the disclosure can include any one or a combination of the following features:

a voltage is applied to the conductive tape to cool or heat the seating surface;

air in the recess carries heat away from or toward the conductive tape; and/or a film is disposed in the recess.

According to yet another aspect of the present disclosure, a seating assembly comprises a seat including a cushion on a seating surface. The seating assembly further includes a recess including at least two branches coming together at a junction and extending in a direction parallel with the seating surface. The seating assembly also includes an elongate carrier having a plurality of thermoelectric devices and disposed below the seating surface and a bellows extending through the cushion and in fluid communication with the junction and an air mover.

Embodiments of the third aspect of the disclosure can include any one or a combination of the following features:

an upper conductor and a lower conductor, the upper conductor being above the thermoelectric devices and the lower conductor being below the thermoelectric devices, the upper conductor, the thermoelectric devices, and the lower conductor being in thermal communication with one another wherein a voltage is applied to the thermoelectric devices to cool or heat the seating surface; and/or air in the recess helps to cool or heat the seating surface.

These and other aspects, objects, and features of the present disclosure will be understood and appreciated by those skilled in the art upon studying the following specification, claims, and appended drawings.

DETAILED DESCRIPTION

Figure 1:
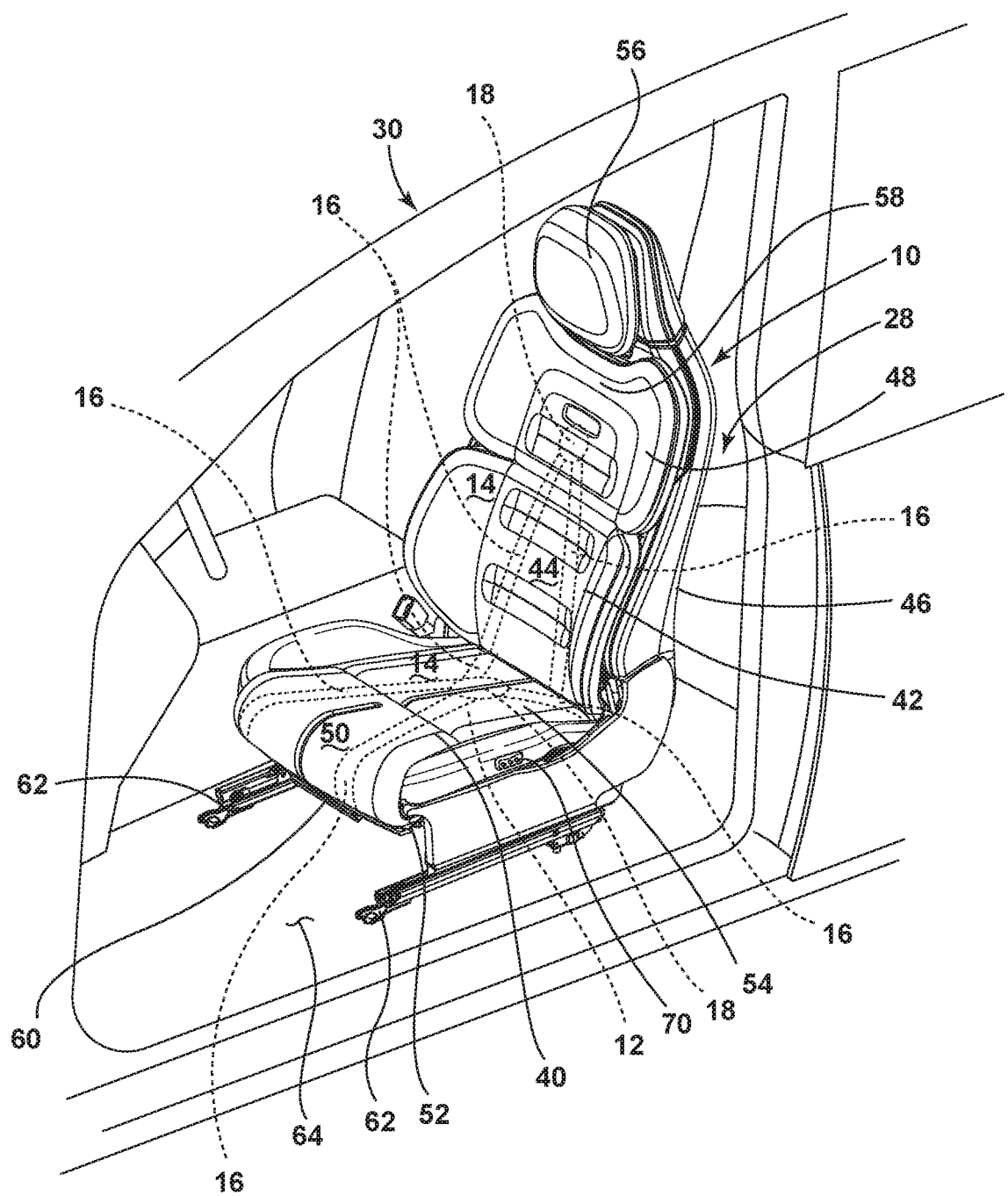
FIG. 1 is a side perspective view of the vehicle seating assembly in a vehicle of an aspect of the present disclosure.

For purposes of description herein, the terms "upper," "lower," "right," "left," "rear," "front," "vertical," "horizontal," and derivatives thereof shall relate to the disclosure as oriented in FIG. 1. However, it is to be understood that the disclosure may assume various alternative orientations, except where expressly specified to the contrary. It is also to be understood that the specific devices and processes illustrated in the attached drawings, and described in the following specification are simply exemplary aspects of the inventive concepts defined in the appended claims. Hence, specific dimensions and other physical characteristics relating to the aspects disclosed herein are not to be considered as limiting, unless the claims expressly state otherwise.

Referring to FIGS. 1-12, a vehicle seating assembly 10 includes a cushion 12 and a seating surface 14. A recess 142 includes at least two branches defined in the cushion 12. The two branches come together at a junction 18 and extend in a direction parallel with the seating surface 50. An elongate carrier 82 is disposed between the recess 142 and the seating surface 50. The elongate carrier 82 includes a plurality of thermoelectric devices 20 arranged along the recess 142. A flexible bellows 212 extends through the cushion 12 and has a first end 111 in fluid communication with the junction 18 and a second end 113 in fluid communication with an air mover 114.

Referring to FIG. 1, the vehicle seating assembly 10 is illustrated inside a cabin 28 of a vehicle 30. The vehicle seating assembly 10 may be a seat for a driver, a seat for a passenger, a rear bucket seat, a rear row of seats, or any other vehicle seat. The vehicle seating assembly 10 includes a seat 40 and a seatback 42 pivotably attached to the seat 40. The seatback 42 of the vehicle seating assembly 10 includes a forward facing seating surface 44 and a rearward facing seating surface 46. The forward facing seating surface 44 may be covered with a seatback trim 48. The seat 40 of the vehicle seating assembly 10 includes an upward facing seating surface 50 and a downward facing seating surface 52. The upward facing seating surface 50 may be covered with a seat trim 54. The vehicle seating assembly 10 also includes a headrest 56 operably coupled to an upper portion 58 of the seatback. The vehicle seating assembly 10 also typically includes a vehicle seat base 60 configured to provide structural support to the vehicle seating assembly 10. The vehicle seat base 60 is preferably supported on seat mounting rail assemblies 62. The seat mounting rail assemblies 62 are configured to allow the vehicle seating assembly 10 to be adjusted in forward and rearward directions relative to the longitudinal axis of the vehicle 30.

Referring again to FIG. 1, it is understood that the vehicle seating assembly 10 may be positioned in various locations throughout the vehicle 30 other than the illustrated position, such as a passenger side location, a mid-row location, and a rear seat location. The vehicle seating assembly 10 is thereby slidably coupled with a floor 64. It is also conceivable that the vehicle seating assembly 10 may not include the seat mounting rail assemblies 62 and alternatively may be fixedly coupled with the floor 64 of the vehicle 30.

In certain conditions, when temperature and atmospheric conditions are outside of an occupant's comfort range, the seat 40 and the seatback 42 may be uncomfortably warm or cold, such that the vehicle seating assembly 10 may not provide the occupant with comfortable transit in a vehicle. Accordingly, providing a temperature control system 70, as generally set forth in FIGS. 1-31, readily changes the temperature at an interface between the occupant and the vehicle seating assembly 10, and in particular, between the occupant and the seat 40 and the seatback 42, thus providing for a more pleasant traveling experience for the occupant.

Figure 2:
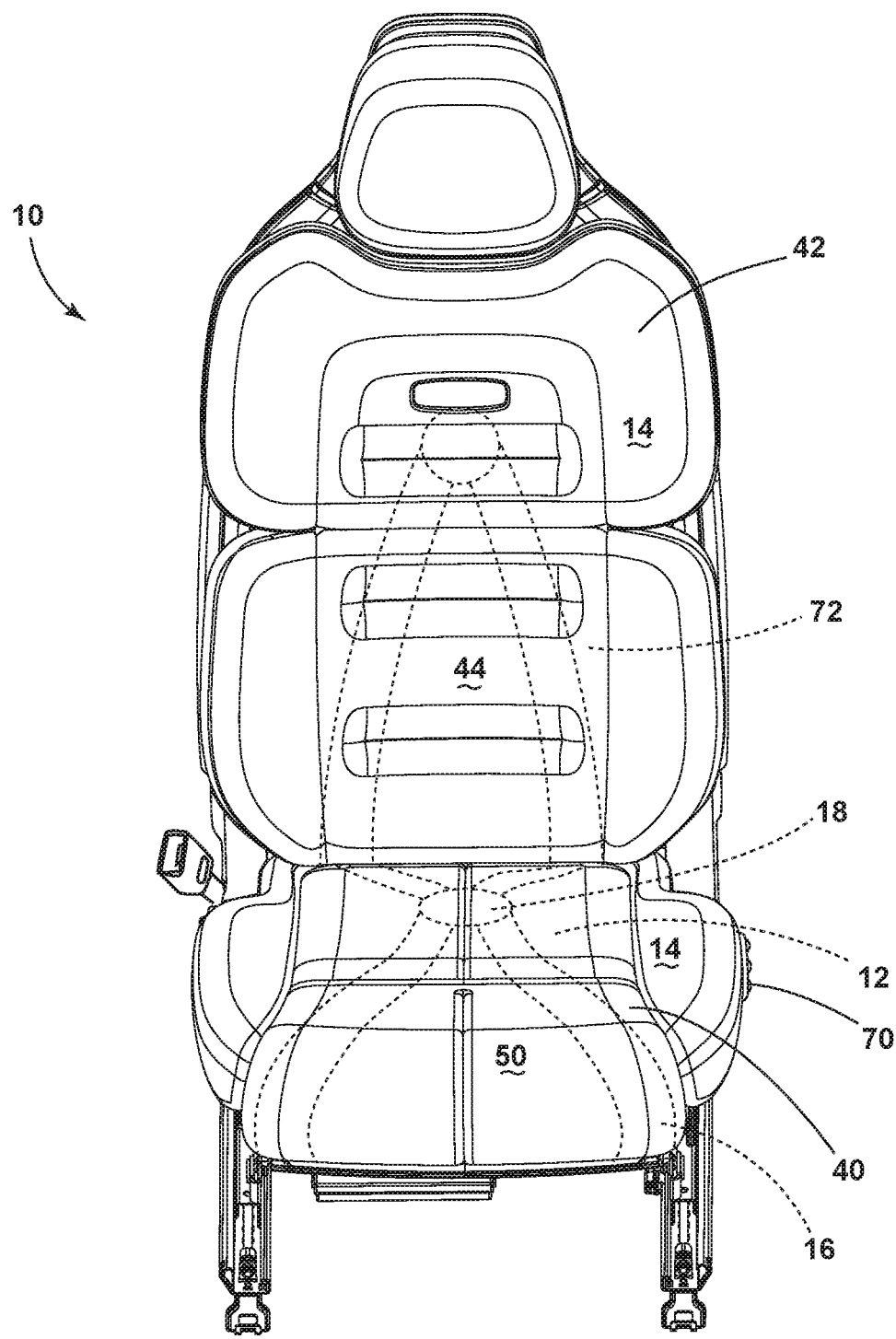
FIG. 2 is a front perspective view of the vehicle seating assembly of an aspect of the present disclosure.

Referring to FIG. 2, the vehicle seating assembly 10 is shown. The seat 40 includes the seat cushion 12. Tape 16 extends outwardly from the hub 18. The seatback 42 includes the seatback cushion 72. Tape 16 extends outward from a hub 18 to a seating surface edge. The seat 40 and the seatback 42 are both configured for use with the temperature control system 70. Hub 18 may also be referred to as a junction. The temperature control system 70 is activated to regulate the temperature of the upward facing seating surface 50 and the forward facing seating surface 44. In the depicted aspect, the temperature control system 70 is in communication with the wiring harness of the vehicle seating assembly 10. In various aspects, the temperature control system 70 is in communication with other seat powering means. In various aspects, the temperature control system 70 is also in communication with the air movers 114 to regulate the flow of air proximate the thermoelectric devices 20 of tape 16. The temperature control system 70 may be activated by a user or in response to a system input. The temperature control system 70 may be activated manually, remotely, wirelessly or in any other manner known to those of skill in the art. The temperature control system 70 may cool or heat the occupant. In another aspect, the temperature control system 70 may include sensors that sense occupant temperature and/or interior vehicle temperature and automatically adjust the vehicle seating assembly 10 to a desired temperature.

Referring now to FIGS. 1-12, the tape 16 has a first end 74 and a second end 76. The first end 74 is at the hub 18. The second end 76 is at a seating surface edge 78. The tape 16 includes an upper conductor 24 and a lower conductor 22 that run along at least part of the length of the tape 16. A plurality of conductive nodes 80 are located along at least part of the length of the tape 16 to cool or heat a portion of the vehicle seating assembly 10 to provide comfort adjustment to an occupant who sits in the vehicle seating assembly 10. A node 80 includes a thermoelectric device 20 disposed between the upper conductor 24 and the lower conductor 22. In the depicted aspect, the tape 16 includes a carrier 82 with apertures 84 for receiving thermoelectric devices 20. Thermoelectric devices 20 are disposed in the apertures 84. The upper conductor 24 is above the carrier 82. The lower conductor 22 is below the carrier 82. The carrier 82 insulates the upper conductor 24 from the lower conductor 22. A first protrusion 90 and a second protrusion 92 extend from the carrier lower surface 94. An air channel 96 is formed below the carrier 82 and between the first protrusion 90 and the second protrusion 92.

Figure 7:
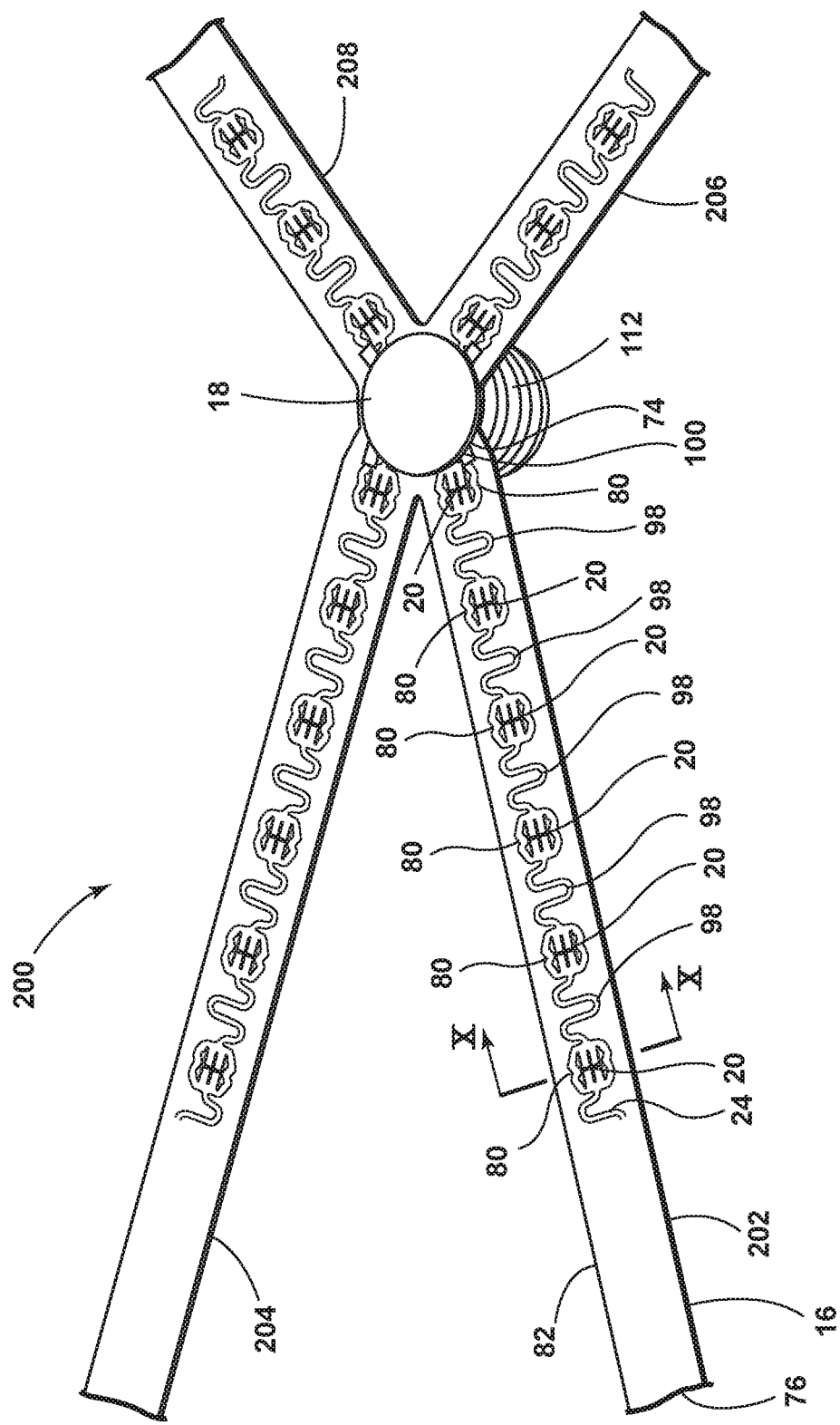
FIG. 7 is a top perspective view of an aspect of the seat tape assembly.
Figure 8:
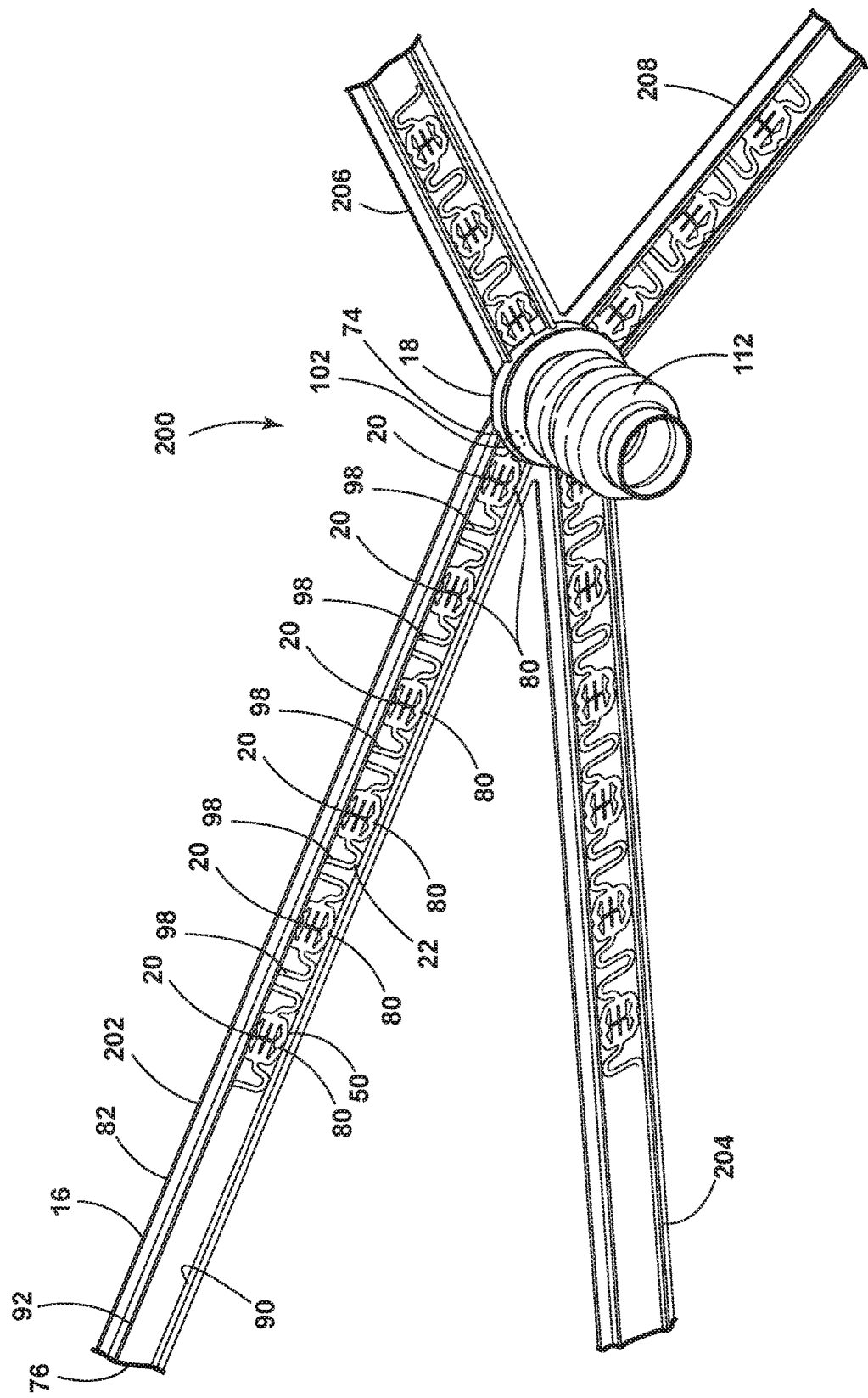
FIG. 8 is a bottom perspective view of the seat tape assembly of FIG. 7.

Referring to FIGS. 7 and 8, the upper conductor 24 and the lower conductor 22 of tape 16 may have flexible shapes 98 between and adjacent to the nodes 80. The flexible shapes 98 are generally serpentine. In various aspects, both the upper conductor 24 and the lower conductor 22 are thermally conductive copper. In various aspects, the upper conductor 24 and the lower conductor 22 are a thin copper metal foil that may be from approximately 0.1 mm to approximately 0.3 mm thick. In various aspects, the foil may be approximately 0.25 mm thick. The upper conductor 24 and the lower conductor 22 may be laser cut from a strip of copper. In the depicted aspect, the copper upper conductor 24 and the copper lower conductor 22 may be more pliable than the carrier 82. In other aspects, the upper conductor 24 and the lower conductor 22 may be made of brass, aluminum, conductive metals, or other materials.

In various aspects, after the carrier 82 is extruded or otherwise formed, the apertures 84 are punched into the carrier 82. In various aspects, the apertures 84 are formed in the carrier 82 during the injection molding process. In yet another aspect, the carrier 82 may be injection molded without the apertures 84, and the apertures 84 may be punched into the carrier 82. In various aspects, the carrier 82 is an elastomeric plastic.

Figure 9:
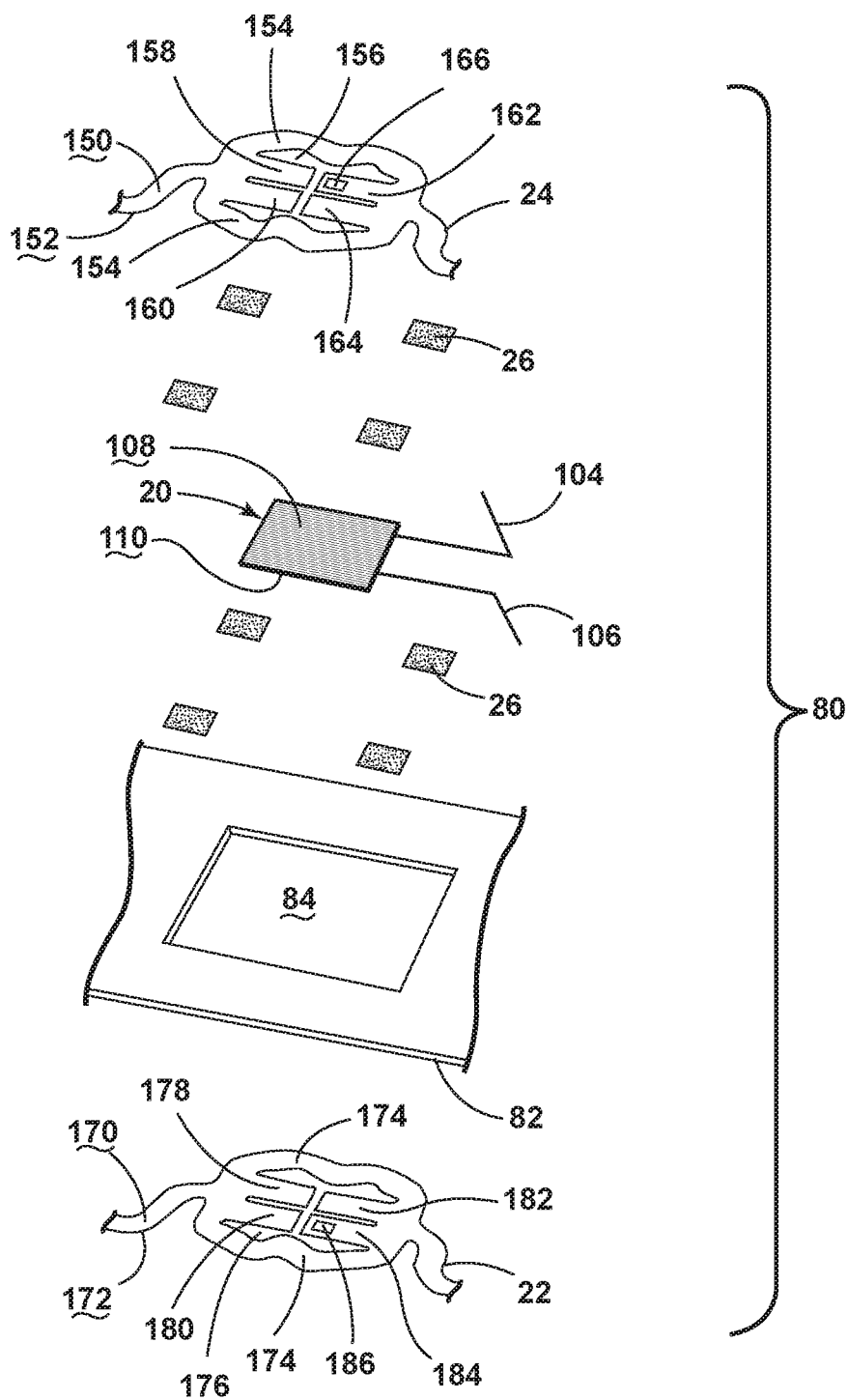
FIG. 9 is an exploded perspective view of an aspect of a node of the tape for a vehicle seating assembly.

Referring again to FIGS. 7 and 8, the tape 16 is powered from a wire harness at the hub 18. The wiring for the tape power may be delivered by the bellows 112. The bellows 112 may also work as an electrical conduit for the wires of the wiring harness. The bellows 112 has a first end 111 and a second end 113. The upper conductor 24 has an electrical connection 100 that attaches to the wire harness at hub 18. The lower conductor 22 has an electrical connection 102 that attaches to the wire harness at hub 18. Referring to FIG. 9, the thermoelectric device 20 has a first wire 104 that is soldered to the upper conductor 24. The thermoelectric device 20 has a second wire 106 that is soldered to the lower conductor 22. The wire harness supplies power to the thermoelectric devices 20 through the upper conductor 24 and the lower conductor 22 at various voltages. The voltage amount determines the temperature differential across the thermoelectric device upper surface 108 and the thermoelectric device lower surface 110. The wire harness supplies the flow of current to the upper conductor 24 and the lower conductor 22 along tape 16. Current flow that is positive to negative from the upper surface 108 of the thermoelectric device 20 to the lower surface 110 of the thermoelectric device 20 cools the seating surface. Conversely, current flow that is negative to positive from the upper surface 108 of the thermoelectric device 20 to the lower surface 110 of the thermoelectric device 20 heats the seating surface.

Referring again to FIG. 3, in the depicted aspect, the bellows 112 is a flexible cushion bellows. In various aspects, the bellows 112 may be made of rubber or other materials known to those of skill in the art. It is contemplated that in various aspects the bellows 112 may be replaced or supplemented by foam rings, locking rings, plastic foam mounts and/or other structures known to those of skill in the art. In the depicted aspect, the seat cushion 12 is made of foam. It is contemplated that in various aspects the seat cushion 12 may be made of various similar materials. Referring to FIGS. 3-6, in various aspects, the air mover 114 may be an extraction fan with an extraction nozzle. The air mover 114 may have a center fan mount at the hub 18 with molded-in recesses 116 to enable air transfer and mounting of the one or more tapes 16 that radiate out from the hub 18.

Figure 10:
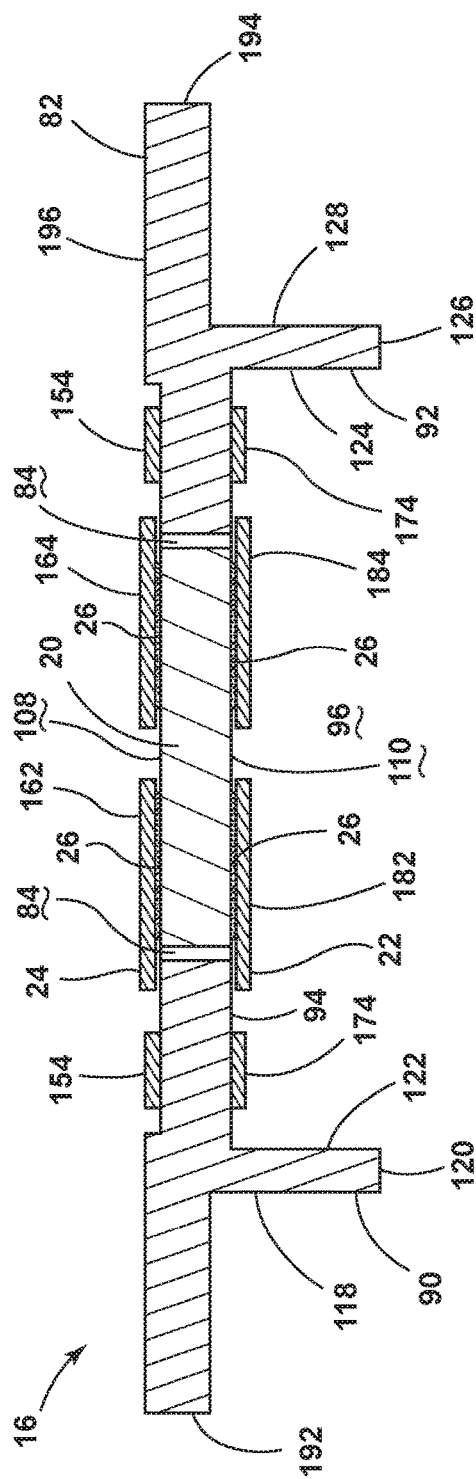
FIG. 10 is a cross-sectional view of the seat tape assembly of FIG. 7, taken along line X-X.
Figure 11:
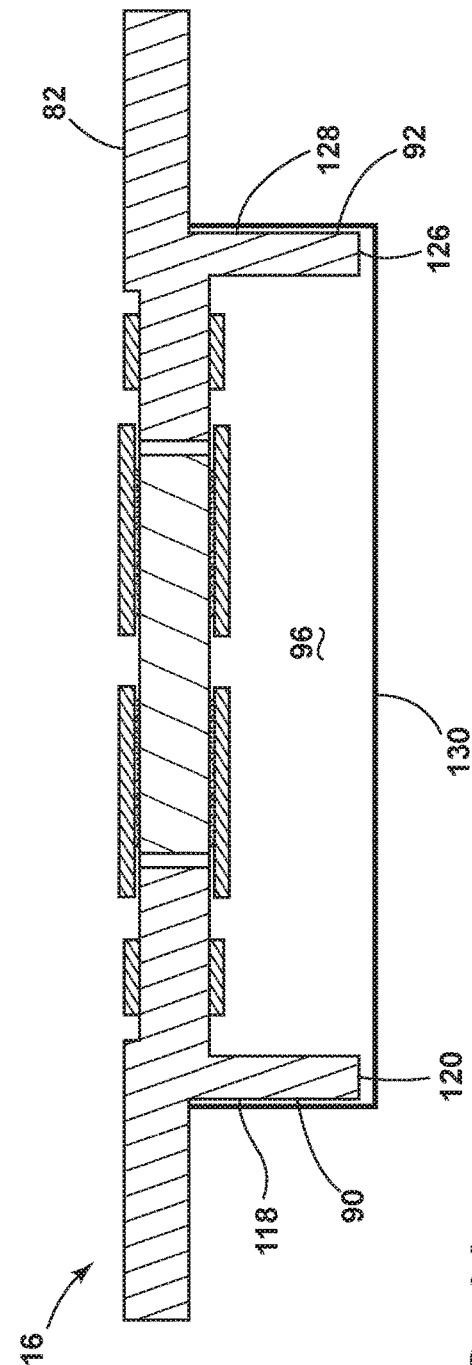
FIG. 11 is a cross-sectional view of the seat tape assembly of FIG. 10 with an aspect of a film member added thereto.
Figure 12:
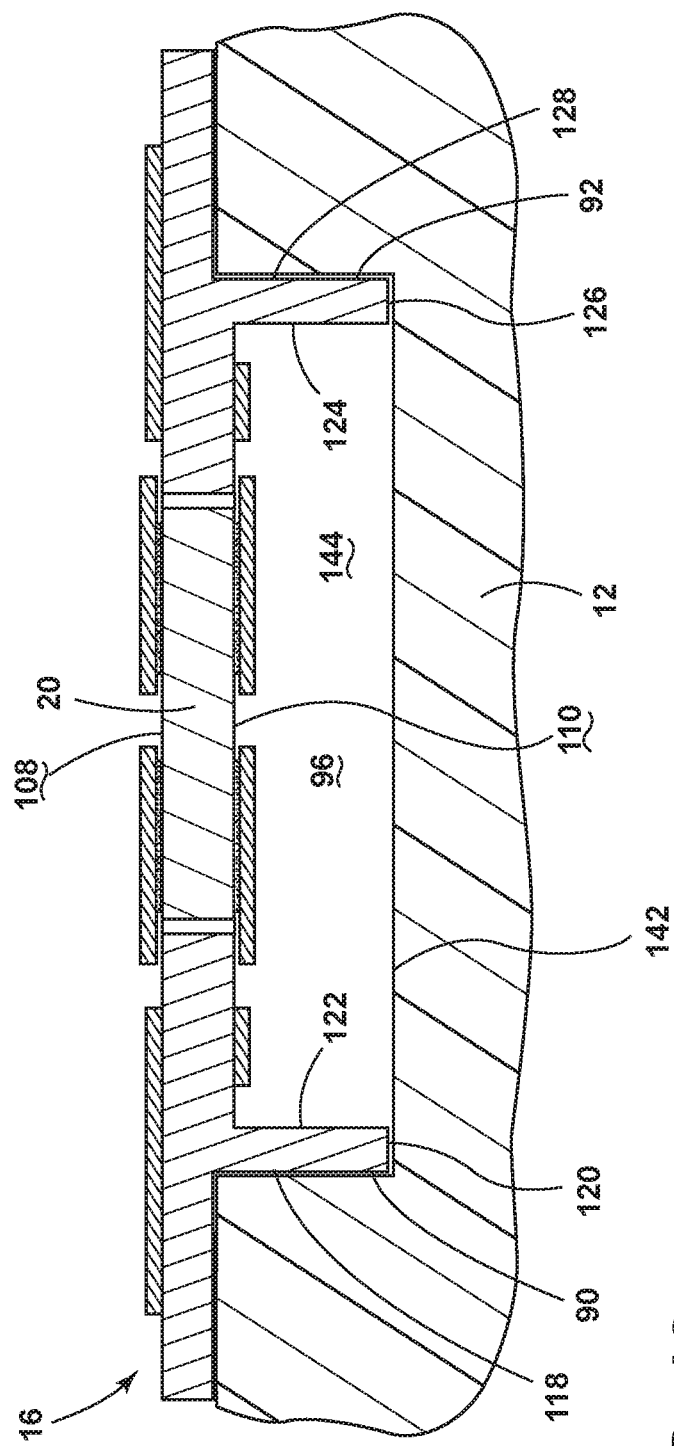
FIG. 12 is a schematic cross-sectional view of the tape in a recess of the seat.

Referring to FIGS. 10-11, the first protrusion 90 that extends from carrier lower surface 94 has a first surface 118, a second surface 120, and a third surface 122. The second protrusion 92 that extends from carrier lower surface 94 has a first surface 124, a second surface 126, and a third surface 128. An air channel 96 is formed beneath the carrier lower surface 94 and the third surface 122 of the first protrusion 90 and the first surface 124 of the second protrusion 92. A film 130 may be affixed to the first surface 118 and the second surface 120 of the first protrusion 90 and the second surface 126 and the third surface 128 of the second protrusion 92. Airflows 140 travel within the air channel 96 and along the nodes 80 to cool or heat the thermoelectric devices 20. Referring to FIG. 12, the recess 142 in the seat cushion 12 and the air channel 96 cooperate to form the air passageway 144.

Referring again to FIG. 9, the thermoelectric device 20 in node 80 has an upper surface 108 and a lower surface 110. The thermoelectric device 20 has a first wire 104 and a second wire 106. The thermoelectric device 20 is positioned within the aperture 84 of the carrier 82 and between the upper conductor 24 and the lower conductor 22.

The upper conductor 24 has an upper surface 150 and a lower surface 152. The upper conductor 24 has outer peripheral portions 154 and interior portion 156. The portions of the upper conductor 24 within the outer peripheral portions 154 define the interior portion 156 with a first tab member 158, a second tab member 160, a third tab member 162, and a fourth tab member 164. A slot 166 for receiving the first wire 104 is in the third tab member 162.

The lower conductor 22 has an upper surface 170 and a lower surface 172. The lower conductor 22 has outer peripheral portions 174 and an interior portion 176. The portions of the lower conductor 22 within the outer peripheral portions 174 define the interior portion 176 with a first tab member 178, a second tab member 180, a third tab member 182, and a fourth tab member 184. A slot 186 for receiving the second wire 106 is in the fourth tab member 184.

In various aspects a plurality of tabs that is not limited to eight tabs (i.e., the first tab member 158, the second tab member 160, the third tab member 162, the fourth tab member 164, and the first tab member 178, the second tab member 180, the third tab member 182, and the fourth tab member 184) may define the interior portion 156 of the upper conductor 24 and the interior portion 176 of the lower conductor 22 at the node 80.

In various aspects, the upper conductor 24 first tab member 158, second tab member 160, third tab member 162, and fourth tab member 164 may be flexibly resilient. In various aspects, the upper conductor 24 first tab member 158 and second tab member 160 are at least partially longitudinally aligned with the upper conductor 24 third tab member 162 and the upper conductor 24 fourth tab member 164.

In various aspects, the lower conductor 22 first tab member 178, second tab member 180, third tab member 182, and fourth tab member 184 may be flexibly resilient. In various aspects, the lower conductor 22 first tab member 178 and second tab member 180 are at least partially longitudinally aligned with the lower conductor 22 third tab member 182 and the lower conductor 22 fourth tab member 184.

Adhesives 26 secure the upper conductor 24 to the thermoelectric device 20. Adhesives 26 secure the first tab member 158, the second tab member 160, the third tab member 162, and the fourth tab member 164 to the upper surface 108 of the thermoelectric device 20. Adhesives 26 secure the lower conductor 22 to the thermoelectric device 20. Adhesives 26 secure the first tab member 178, the second tab member 180, the third tab member 182, and the fourth tab member 184 to the lower surface 110 of the thermoelectric device 20.

The first wire 104 is inserted into the slot 166 and soldered to the upper conductor 24. The second wire 106 is inserted into the slot 186 and soldered to lower conductor 22. The adhesives 26 are thermally conductive adhesives. The thermoelectric device 20 is in thermal contact with the upper conductor 24 and the lower conductor 22 through the adhesives 26. The thermoelectric device 20 is in electrical contact with the upper conductor 24 through the first wire 104. The thermoelectric device 20 is in electrical contact with the lower conductor 22 through the second wire 106.

Each thermoelectric device 20 includes pairs of P-type and N-type semi-conductor thermoelement forming thermocouples which are connected electrically in series and thermally in parallel. A standard module includes thermocouples connected in series and sandwiched between two ceramic plates. By applying a current to the module one ceramic plate is heated while the other is cooled. The direction of the current determines which plate is cooled. The number and size of the thermocouples as well as the materials used in their manufacturing determine the cooling capacity. The voltage applied to the thermoelectric devices 20 determines the temperature of the thermoelectric device upper surface 108 and the temperature of the thermoelectric device lower surface 110.

Referring again to FIG. 9, in the depicted aspect, the ceramic material that typically is used for the upper surface 108 and the lower surface 110 of the thermoelectric device 20 has a low coefficient of thermal expansion. The copper material that is used in the depicted aspect for the upper conductor 24 and the lower conductor 22 has a higher coefficient of thermal expansion than the ceramic material of the upper surface 108 and the lower surface 110 of the thermoelectric device 20. The adhesives 26 may be an adhesive material matrix filled with powdered bits of conductive materials such as silver, zinc, or copper. The adhesive may be soft, springy, and/or resilient. The adhesive deposits may be in the range of approximately 0.1 mm to approximately 1.00 mm thick. The adhesive has properties, including how much the adhesive flexes during operation and how thick the adhesive should be to accommodate internal adhesive shear and other stresses during operation. The adhesive properties are such that they can withstand the stresses applied to the adhesive during operation of the temperature control system 70 and during typical vehicle seat use (knee loads applied by occupants, seating and baggage loads, etc.).

FIG. 10 shows a cross-section of the tape 16 taken along line X-X of FIG. 7. The thermoelectric device 20 is located between the upper conductor 24 and the lower conductor 22 and within the aperture 84 of the carrier 82. A first protrusion 90 and a second protrusion 92 extend from the carrier 82.

The upper conductor 24 third tab member 162 and the fourth tab member 164 are located above the thermoelectric device 20 and the carrier 82. Adhesives 26 are between the third tab member 162 and the thermoelectric device 20 and the fourth tab member 164 and the thermoelectric device 20. Similarly, in the depicted aspect, the third tab member 182 and the fourth tab member 184 of the lower conductor 22 are below the thermoelectric device 20 and the carrier 82. Adhesives 26 are between the third tab member 182 and the thermoelectric device 20 and the fourth tab member 184 and the thermoelectric device 20. The upper conductor 24 outer peripheral portion 154 is above the carrier 82. The lower conductor 22 outer peripheral portion 174 is below the carrier 82.

As previously stated, the first protrusion 90 has a first surface 118, a second surface 120, and a third surface 122. The second protrusion 92 has a first surface 124, a second surface 126, and a third surface 128. An air channel 96 is between the third surface 122 of the first protrusion 90 and the first surface 124 of the second protrusion 92 and below carrier 82, lower conductor 22, and thermoelectric device 20.

Referring again to FIG. 10, in various aspects, the carrier 82 may be approximately 40 mm to approximately 60 mm wide when measured horizontally from a first carrier edge 192 to a second carrier edge 194. Carrier 82 may be approximately 3 mm to approximately 40 mm high when measured vertically from a carrier upper surface 196 to the second surface 120 of the first protrusion 90 or the second surface 126 of the second protrusion 92. The horizontal distance between the third surface 122 of the first protrusion 90 and the first surface 124 of the second protrusion 92 may be approximately 20 mm to approximately 40 mm. In various aspects, the thermoelectric devices 20 may be a substantially square shape with each of the sides being approximately 10 mm to approximately 20 mm long.

In various aspects, the carrier 82 may be approximately 45 mm wide when measured horizontally from a first carrier edge 192 to a second carrier edge 194. The carrier 82 may be approximately 20 mm high when measured vertically from a carrier upper surface 196 to the second surface 120 of the first protrusion 90 or the second surface 126 of the second protrusion 92. The horizontal distance between the third surface 122 of the first protrusion 90 and the first surface 124 of the second protrusion 92 is approximately 25 mm. In various aspects, the thermoelectric devices 20 may be a substantially square shape with each of the sides being approximately 13 mm long. In various aspects, the carrier 82 and the thermoelectric devices 20 may be in various dimensions known to those of skill in the art.

FIG. 11 is the carrier of FIG. 10 with a film 130 around the first protrusion 90 and the second protrusion 92. The film 130 wraps around the first surface 118 and the second surface 120 of the first protrusion 90 and extends to and wraps around the second surface 126 and the third surface 128 of the second protrusion 92. In various aspects, the film 130 may be adhesively secured to the carrier 82 and/or welded onto the carrier 82.

Referring again to FIG. 3, an exploded view of the seat 40 is shown. The upward facing seating surface 50 includes the seat trim 54. The seat tape assembly 200 is shown above the seat cushion 12. The seat tape assembly 200 includes a first seat tape 202, a second seat tape 204, a third seat tape 206, and a fourth seat tape 208 extending outward from the seat hub 210 and a seat bellows 212 extending downward from the seat hub 210. The first ends 74 of the first seat tape 202, the second seat tape 204, the third seat tape 206, and the fourth seat tape 208 are attached to the seat hub 210. The second ends 76 of the first seat tape 202, the second seat tape 204, the third seat tape 206, and the fourth seat tape 208 extend to the seating surface edges 78. In the depicted aspect, a tape recess 142 in the seat cushion 12 corresponds to the first seat tape 202, the second seat tape 204, the third seat tape 206, and the fourth seat tape 208. A bellows recess 214 corresponds to the seat bellows 212. The tape recesses 142 and the bellows recess 214 are molded into the seat cushion 12. The seat tape assembly 200 is arranged in the seat cushion 12 so that the first seat tape 202 heats the occupant's left leg, the second seat tape 204 heats the occupant's right leg, the third seat tape 206 heats the occupant's left buttock, and the fourth seat tape 208 heats the occupant's right buttock.

The tape recesses 142 include bottom surfaces 216 and recess edges 217. Airflows 140 are in each tape recess 142 and in bellows recess 214. An air mover 114 is adjacent to the seat bellows 212. When the seat 40 is assembled, the first seat tape 202, the second seat tape 204, the third seat tape 206, and the fourth seat tape 208 fit into the recesses 142. The seat bellows 212 fits into the recess 214. The seat trim 54 is placed over the seat tape assembly 200 and the seat cushion 12. In the depicted aspect, the seat tape assembly 200 flexibly supports the occupant while providing thermal comfort (breathability and targeted heating or cooling). Air passageways 144 are formed when the first seat tape 202, the second seat tape 204, the third seat tape 206, and the fourth seat tape 208 are coupled to the recesses 142.

Referring to FIGS. 3-6, the air mover 114 may have a center fan mount at the seat hub 210 with molded-in recesses 116 to enable air transfer and mounting of the first seat tape 202, the second seat tape 204, the third seat tape 206, and the fourth seat tape 208 that radiate out from the seat hub 210. Arrows 140 show the flow of air into recesses 116 and toward the air mover 114. The air mover 114 may be an extraction fan with an extraction nozzle. In another aspect, the direction of airflows of arrows 140 may be reversed. The air mover 114 may be configured to expel air into the seat bellows 212, through the recesses 116, and into the ambient air beyond the recess edges 217.

Figure 13:
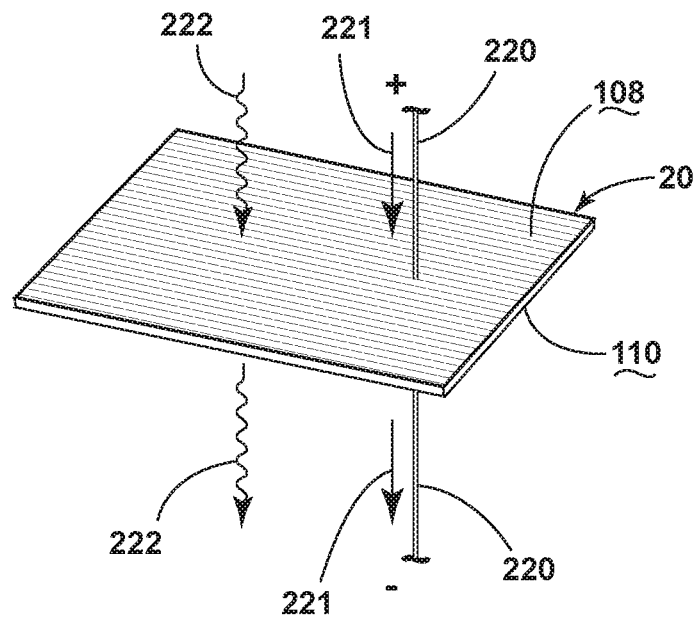
FIG. 13 is an electricity/heat schematic showing heat traveling from the upper surface of the thermoelectric device to the lower surface of the thermoelectric device of an aspect of the present disclosure.
Figure 14:
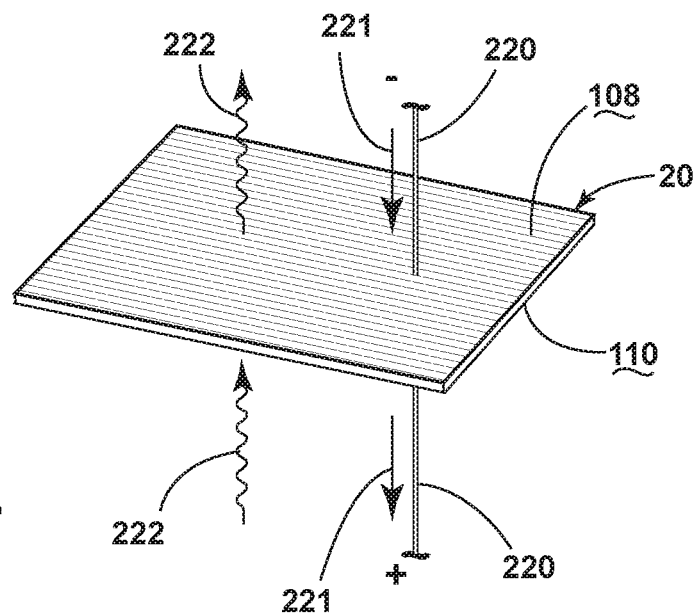
FIG. 14 is an electricity/heat schematic showing heat traveling from the lower surface of the thermoelectric device to the upper surface of the thermoelectric device of an aspect of the present disclosure.

Referring to FIGS. 13-14, schematics of current directions and heat flows of the thermoelectric device 20 in the occupant cooling and occupant heating modes are shown. In FIG. 13, current 220 flows from the thermoelectric device upper surface 108 to the thermoelectric device lower surface 110 in the depicted positive to negative direction. Arrows 221 depict the direction of current 220 flow. Heat 222 flows from the cold thermoelectric device upper surface 108 to the hot thermoelectric device lower surface 110 thereby absorbing heat from around the seat surface and, as a result, cools the seating surface 14. Referring to FIG. 14, current flows from the thermoelectric device upper surface 108 to the thermoelectric device lower surface 110 in a negative to positive direction. Arrows 221 depict the direction of current 220 flow. Heat is absorbed from the cold thermoelectric device lower surface 110 and heat is simultaneously rejected by the upper surface 108 to heat the seating surface 14.

Figure 15:
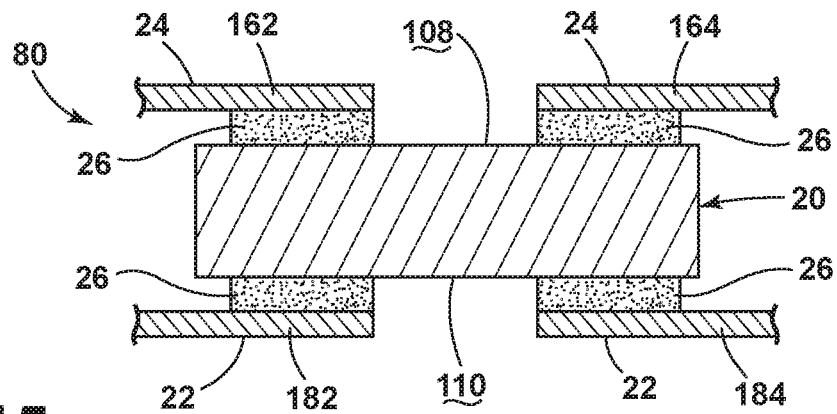
FIG. 15 is a schematic of the thermoelectric device with adhesive and upper and lower conductors in an idle view of an aspect of the present disclosure.
Figure 16:
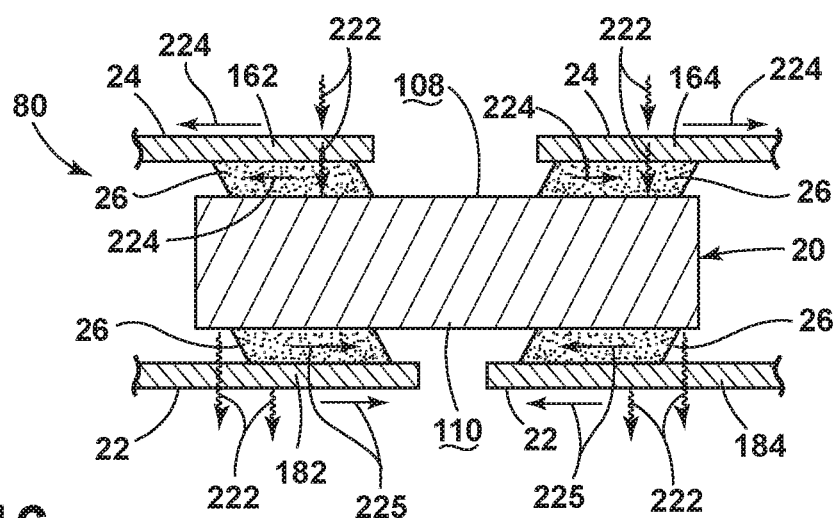
FIG. 16 is a schematic of the thermoelectric device with adhesive and upper and lower conductors in the use state of heat traveling from the upper surface of the thermoelectric device to the lower surface of the thermoelectric device.
Figure 17:
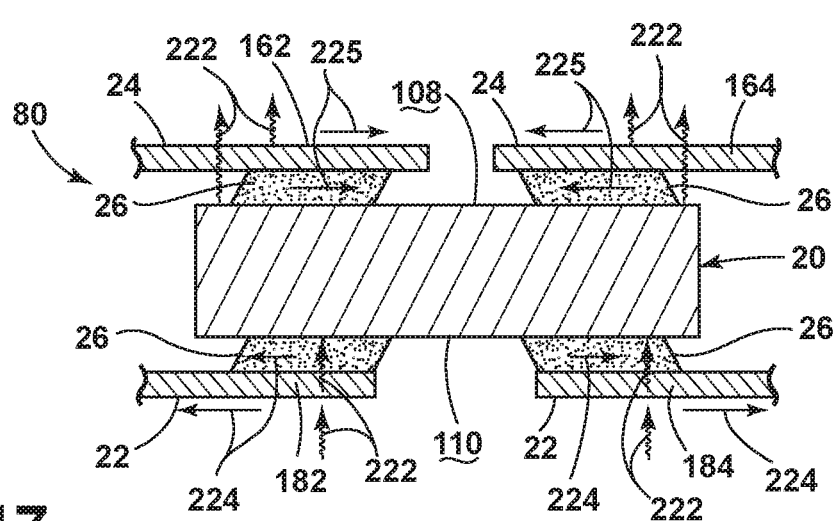
FIG. 17 is a schematic of the thermoelectric device with adhesive and upper and lower conductors in the use state of heat traveling from the lower surface of the thermoelectric device to the upper surface of the thermoelectric device.

With reference to FIGS. 15-17, schematics of the heat transfer, deflections, contractions, and movements at node 80 during idle, seating surface cooling, and seating surface heating states are shown.

Referring to FIG. 15, the thermoelectric device 20 in non-use (idle) state is affixed to the upper conductor 24 and the lower conductor 22 with adhesives 26. The upper conductor third tab member 162 and the upper conductor fourth tab member 164 are adhesively connected to the upper surface 108 of the thermoelectric device 20. The lower conductor third tab member 182 and the lower conductor fourth tab member 184 are adhesively connected to the lower surface 110 of the thermoelectric device 20.

Figure 3:
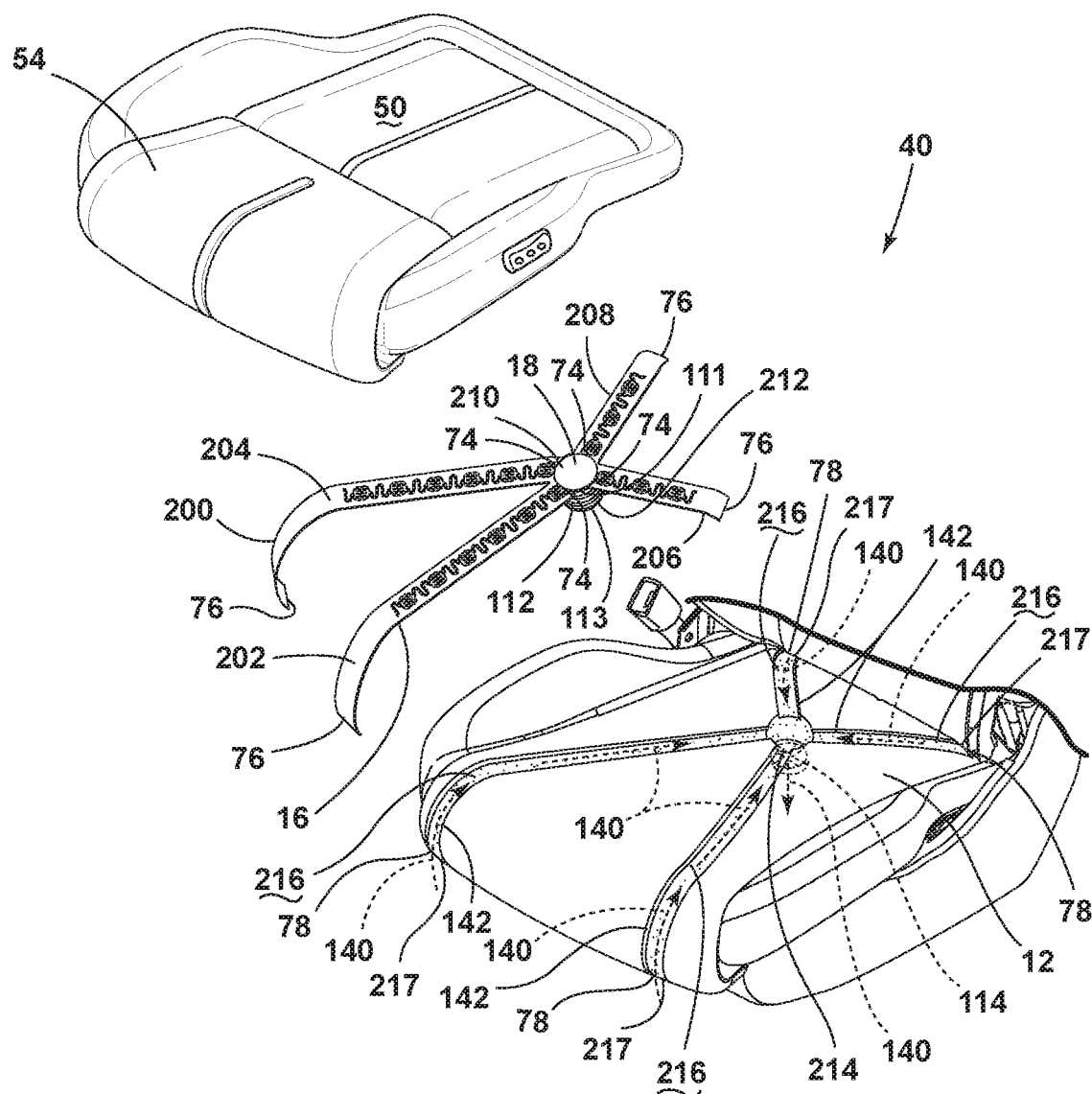
FIG. 3 is an exploded perspective view of the seat of the vehicle seating assembly of an aspect of the present disclosure.
Figure 4:
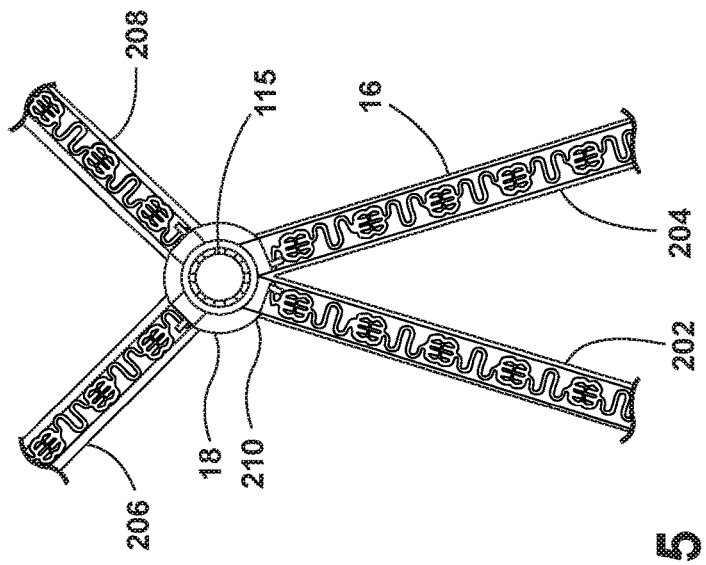
FIG. 4 is a top plan view of an aspect of the seat hub for the vehicle seating assembly of the present disclosure.
Figure 5:
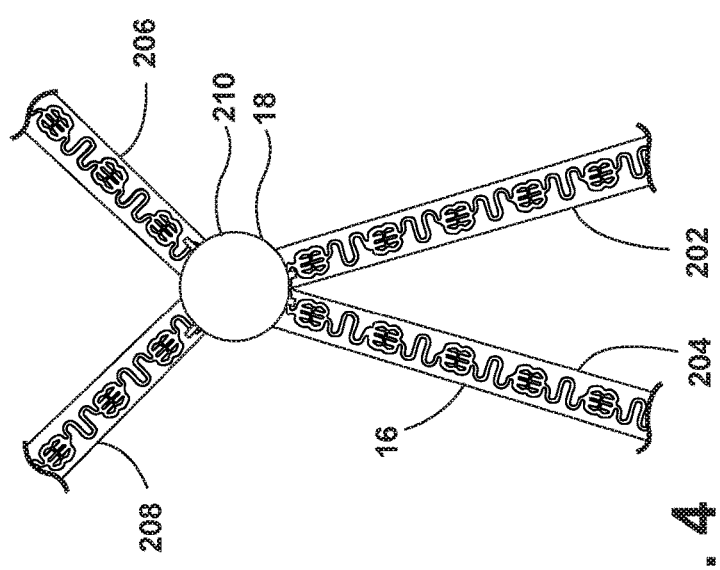
FIG. 5 is a bottom plan view of the seat hub of FIG. 4.
Figure 6:
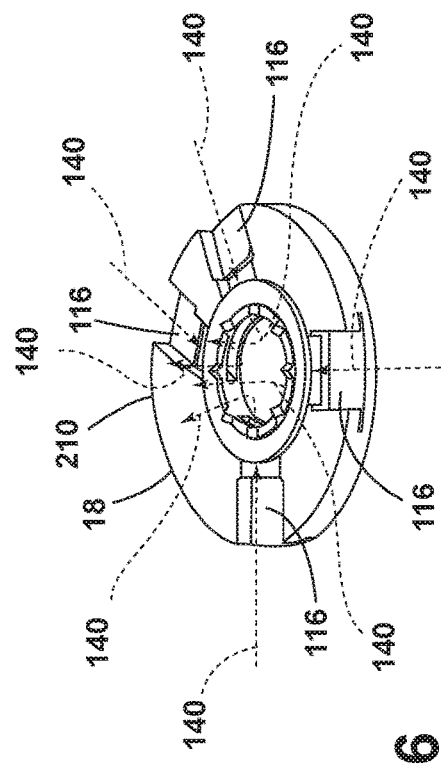
FIG. 6 is a bottom perspective view of the seat hub of FIG. 4 with the tapes removed.
Figure 18:
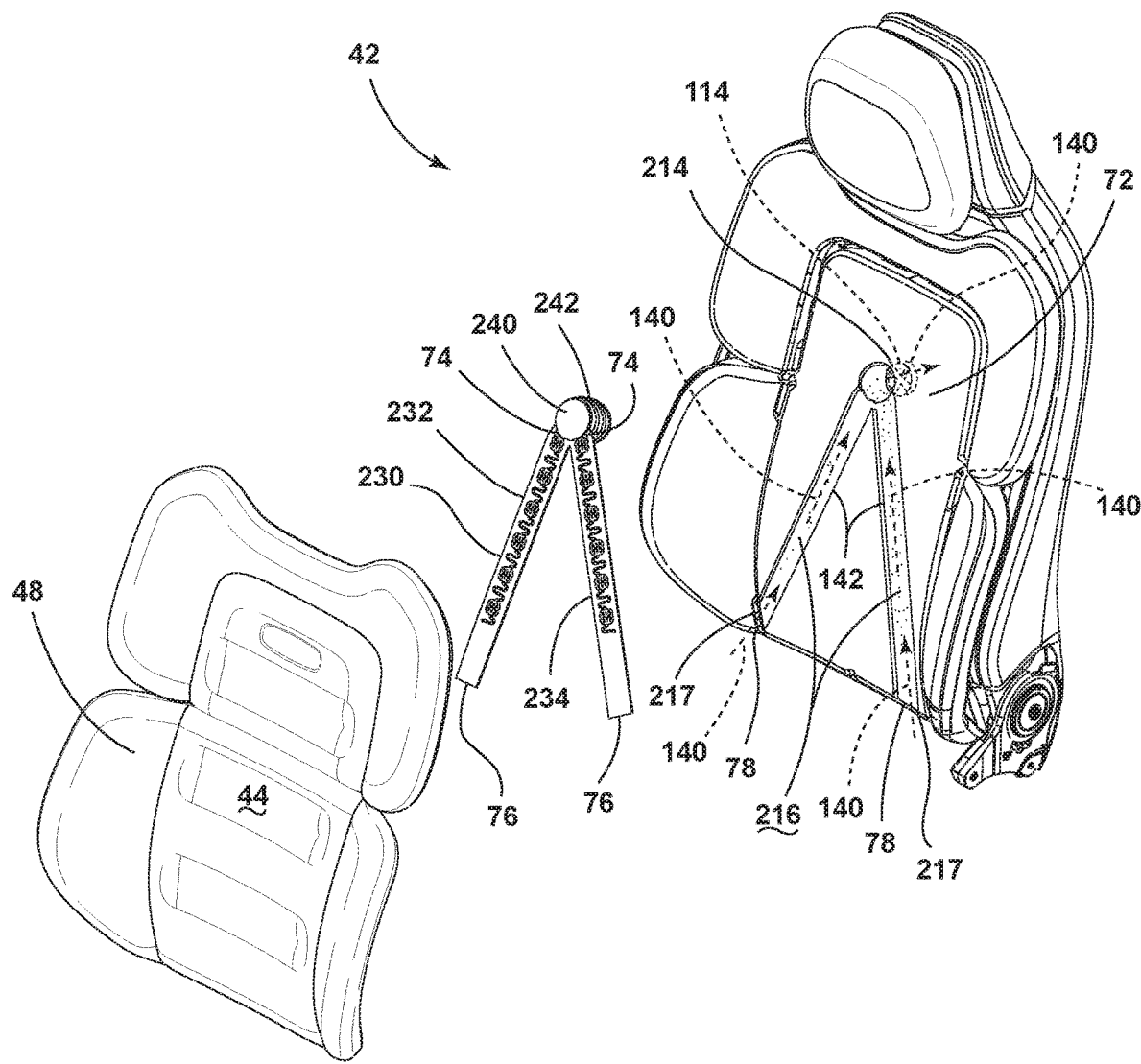
FIG. 18 is an exploded perspective view of the seatback of the vehicle seating assembly of an aspect of the present disclosure.
Figure 19:
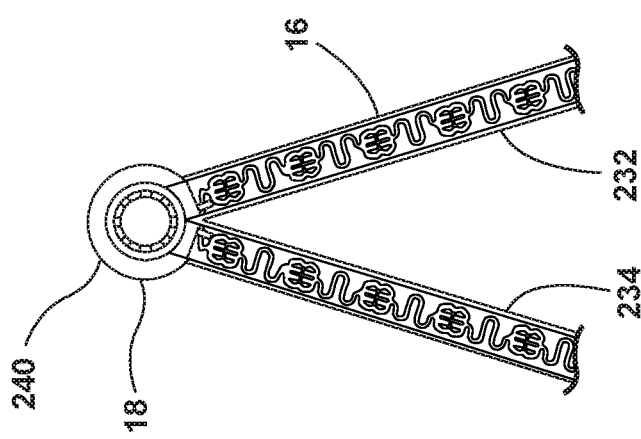
FIG. 19 is a top plan view of an aspect of the seatback hub for the vehicle seating assembly of the present disclosure.
Figure 21:
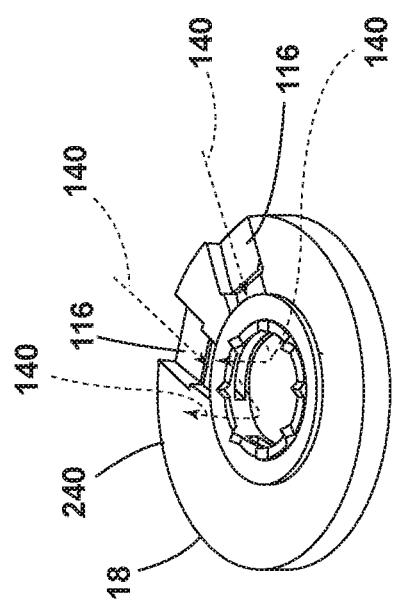
FIG. 21 is a bottom perspective view of the seatback hub of FIG. 19 with the tapes removed.
Figure 20:
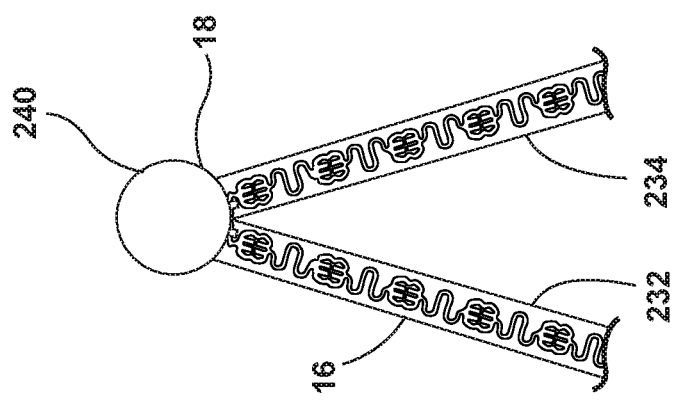
FIG. 20 is a bottom plan view of the seatback hub of FIG. 19.

FIG. 16 depicts the thermoelectric device 20 of FIG. 15 when the temperature control system 70 is activated to cool the occupant. Heat 222 is drawn away from the seating surface 14 by the cold upper surface 108 of the thermoelectric device 20. Heat travels through the upper conductor 24 and the thermally conductive adhesives 26 to the cold upper surface 108 of the thermoelectric device 20. During this heat transfer, the upper conductor 24 and the adhesives 26 may contract slightly and laterally in the direction shown by arrows 224. The hot lower surface 110 of the thermoelectric device 20 then transfers heat to the thermally conductive adhesive 26 and the lower conductor 22. The heat transfer takes place through the adhesives 26 and the lower conductor 22 at heat flows 222. As the lower conductor 22 is heated, the third tab member 182 and the fourth tab member 184 and adhesives 26 may expand slightly and laterally in the directions shown by arrows 225. Referring to FIGS. 3 and 18, airflows 140 carry the heat from the lower conductor 22 to the air mover 114. The air mover 114 expels the heat from the downward facing seating surface 52 and the rearward facing seating surface 46.

FIG. 17 depicts the thermoelectric device of FIG. 15 when the temperature control system 70 is activated to heat the occupant. Heat 222 moves from the air beneath the thermoelectric device 20 through the lower conductor 22 and the adhesives 26. Heat 222 moves from the cold lower surface 110 of the thermoelectric device 20 to the hot upper surface 108 of the thermoelectric device 20. During this heat transfer, the lower conductor third tab member 182, the lower conductor fourth tab member 184, and the adhesives 26 may contract slightly and laterally in the direction shown by arrows 224. The upper surface 108 of the thermoelectric device 20 is hot. Heat moves through the adhesives 26 and through the upper conductor third tab member 162 and the upper conductor fourth tab member 164. The upper conductor third tab member 162, the upper conductor fourth tab member 164, and the adhesives 26 may expand slightly and laterally in the directions shown by arrows 225. Referring to FIGS. 3 and 18, airflows 140 carry air along the lower conductor 22. Thermoelectric devices 20 take the low energy in airflows 140 and increase the energy in the airflows to make air above the thermoelectric devices 20 warmer than air below the thermoelectric devices 20.

The thermally conductive adhesive 26, allows the upper conductor third tab member 162 and the upper conductor fourth tab member 164 and the lower conductor third tab member 182 and the lower conductor fourth tab member 184 to laterally expand and contract and also deflect while maintaining the tabs in physical and thermal contact with the thermoelectric device 20 upper surface 108 and lower surface 110. The tab design allows the copper upper conductor 24 and the copper lower conductor 22 to expand toward or move away from the thermoelectric device 20 and alleviates shear stress to the ceramic upper surface 108 and the ceramic lower surface 110. In some aspects, the thermoelectric devices 20 may undergo tens of thousands of hot and cold cycles during their lifetimes. The upper conductor 24 first, second, third, and fourth tab members 158, 160, 162, 164 and the lower conductor 22 first, second, third, and fourth tab members 178, 180, 182, 184 move within the elastic limits of their intended use. In some aspects, the thermoelectric device 20 upper surface 108 and the lower surface 110 negligibly expand or contract. Flexible joints including the upper conductor first tab member 158, the upper conductor second tab member 160, the upper conductor third tab member 162, and the upper conductor fourth tab member 164 and the lower conductor first tab member 178, the lower conductor second tab member 180, the lower conductor third tab member 182, and the lower conductor fourth tab member 184 and the thermally conductive adhesives 26 help the adhesives remain intact during the tape 16's lifetime. In various aspects, the hot surface of the thermoelectric device 20 may be approximately 50 degrees Celsius, and the cold surface of the thermoelectric device 20 may be approximately 35 degrees Celsius.

Referring to FIG. 18, an exploded view of the seatback 42 is shown. The forward facing seating surface 44 is comprised of the seatback trim 48. A seatback tape assembly 230 is shown in front of the seatback cushion 72. The seatback tape assembly 230 includes a first seatback tape 232 and a second seatback tape 234 extending outward from the seatback hub 240 and a seatback bellows 242 extending downward from the seatback hub 240. The first ends 74 of the first seatback tape 232 and the second seatback tape 234 are attached to the seatback hub 240. The second ends 76 of the first seatback tape 232 and the second seatback tape 234 extend to the seating surface edges 78. In the depicted aspect, a tape recess 142 in the seatback cushion 72 corresponds to the first seatback tape 232 and the second seatback tape 234. A bellows recess 214 corresponds to the seatback bellows 242. The tape recess 142 and the bellows recess 214 are molded into the seatback cushion 72. The tape assembly 230 is arranged in the seatback cushion 72 so that the first seatback tape 232 heats the right side of the occupant's back, and the second seatback tape 234 heats the left side of the occupant's back.

The tape recesses 142 include bottom surfaces 216 and recess edges 217. Airflows 140 are in each tape recess 142 and in bellows recess 214. An air mover 114 is adjacent to the seatback bellows 242. When the seatback 42 is assembled, the first seatback tape 232 and the second seatback tape 234 fit into the recesses 142. The seatback bellows 242 fits into the recess 214. The seatback trim 48 is placed over the seatback tape assembly 230 and the seatback cushion 72. In the depicted aspect, the seatback tape assembly 230 flexibly supports the occupant while providing thermal comfort (breathability and targeted heating or cooling). Air passageways 144 are formed when the first seatback tape 232 and the second seatback tape 234 are coupled to the recesses 142.

Referring to FIGS. 18-21, the air mover 114 may have a center fan mount at the seatback hub 240 with molded-in recesses 116 to enable air transfer and mounting of the first seatback tape 232 and the second seatback tape 234 that radiate out from the seatback hub 240. Arrows 140 show the flow of air into recesses 116 and toward the air mover 114. The air mover 114 may be an extraction fan with an extraction nozzle. In another aspect, the direction of airflows of arrows 140 may be reversed. The air mover 114 may be configured to expel air into the seatback bellows 242, through the recesses 116, and into the ambient air beyond the recess edges 217.

Figure 23:
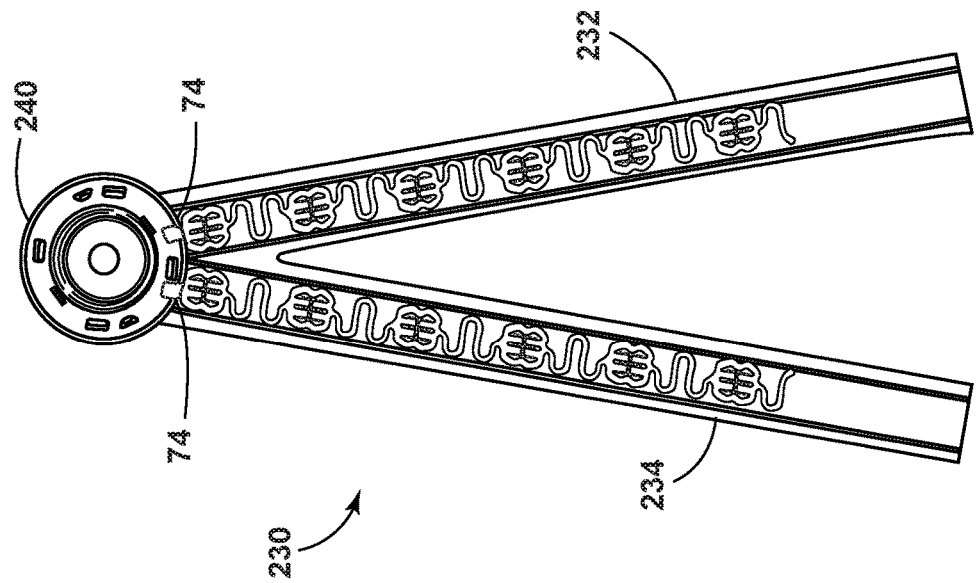
FIG. 23 is a back plan view of the seatback tape assembly of an aspect of the present disclosure.
Figure 22:
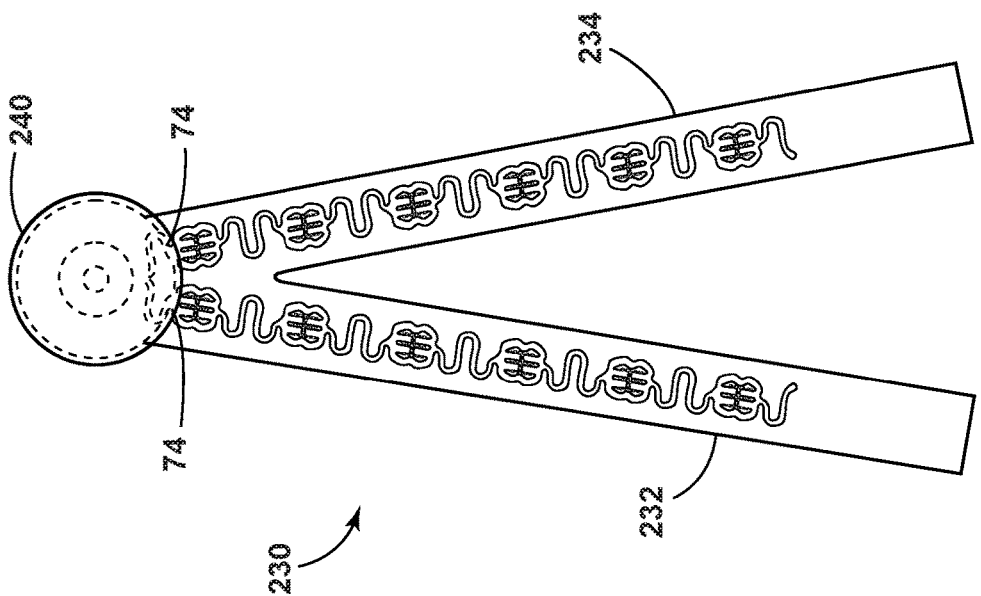
FIG. 22 is a front plan view of the seatback tape assembly of an aspect of the present disclosure.
Figure 24:
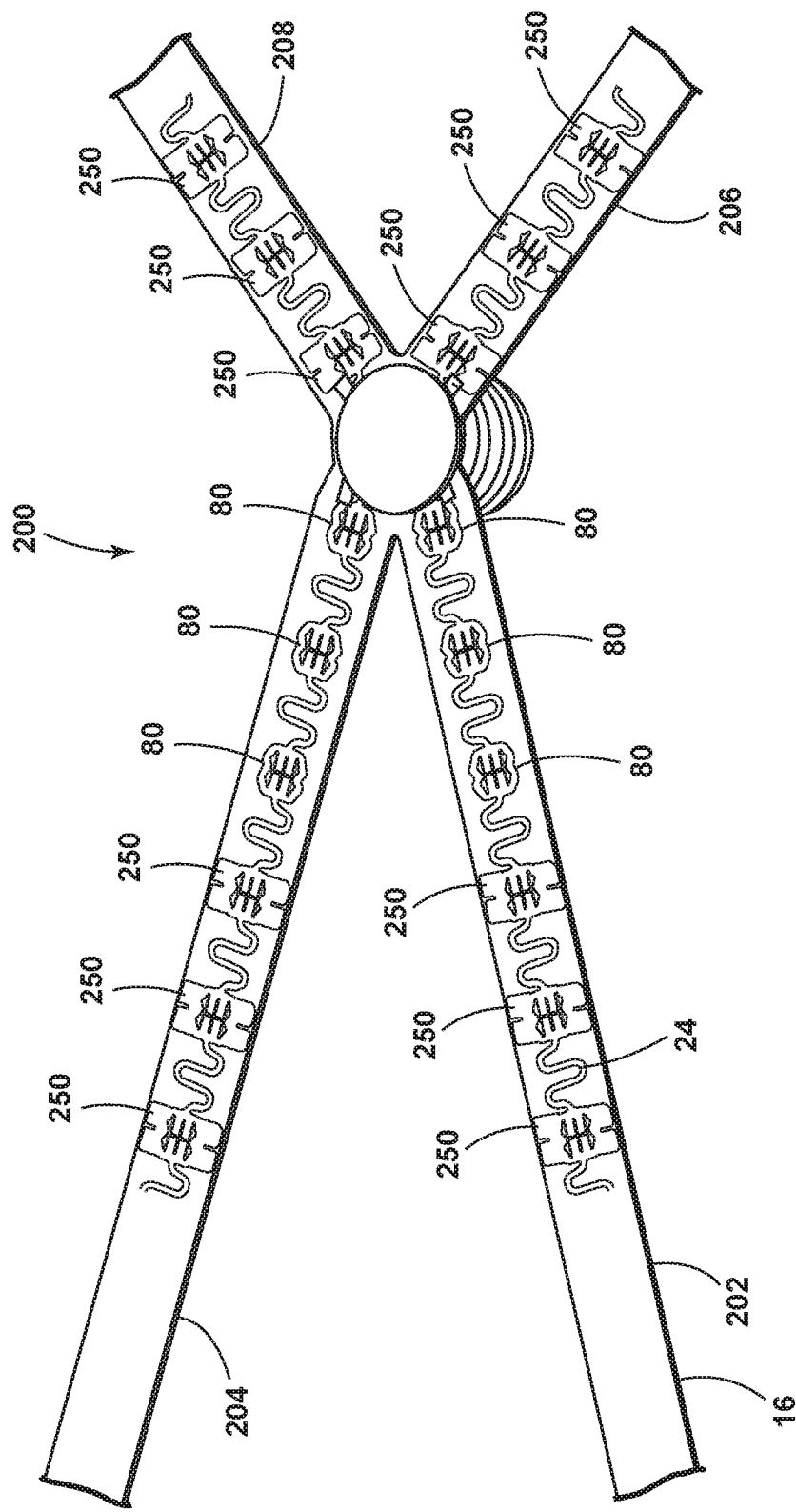
FIG. 24 is a top perspective view of the seat tape assembly of an aspect of the present disclosure.
Figure 25:
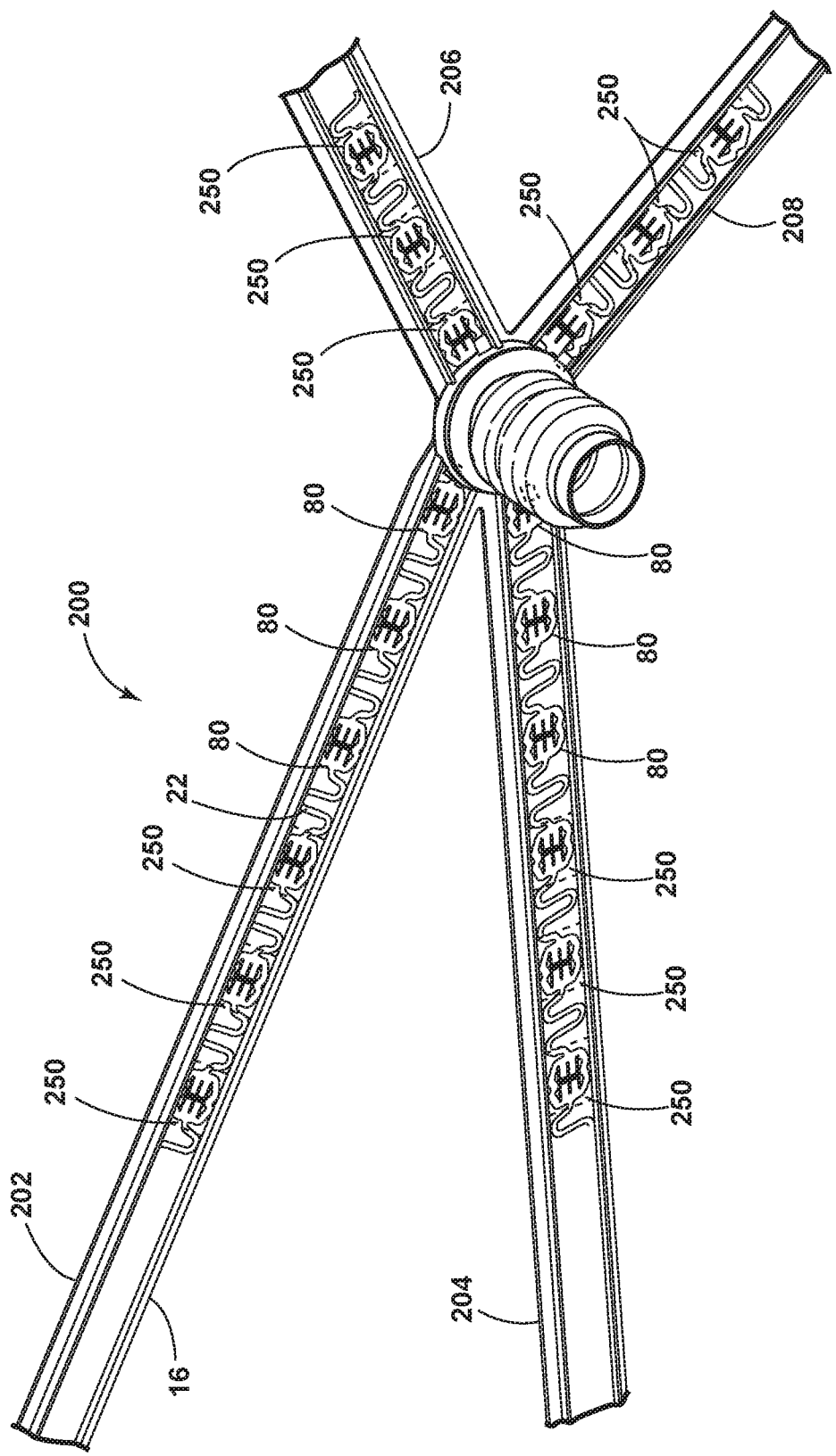
FIG. 25 is a bottom perspective view of the seat tape assembly of an aspect of the present disclosure.
Figure 27:
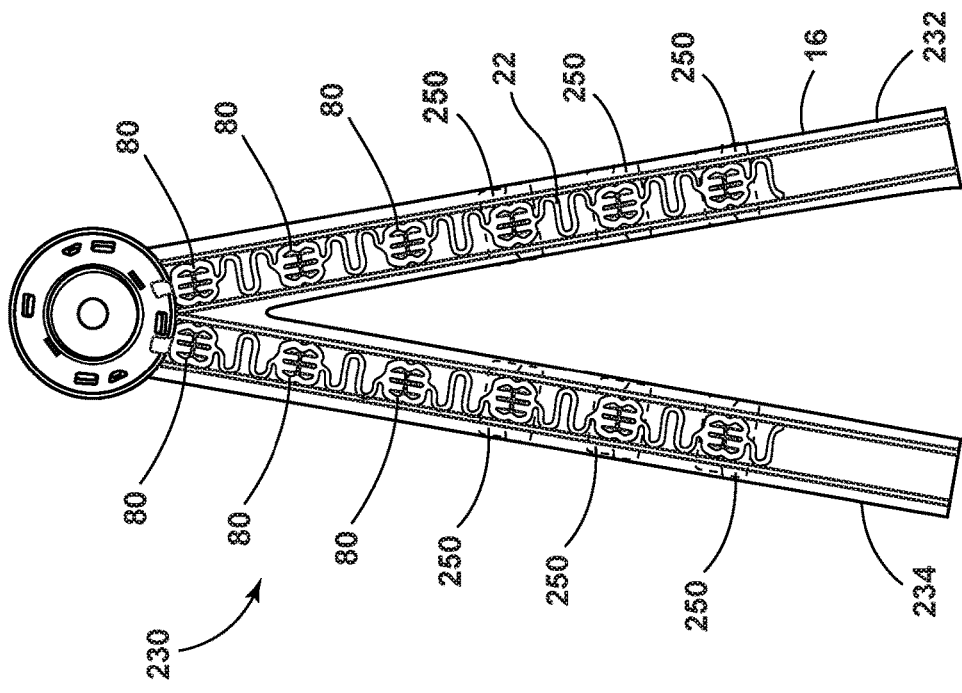
FIG. 27 is a back plan view of the seatback tape assembly of an aspect of the present disclosure.
Figure 26:
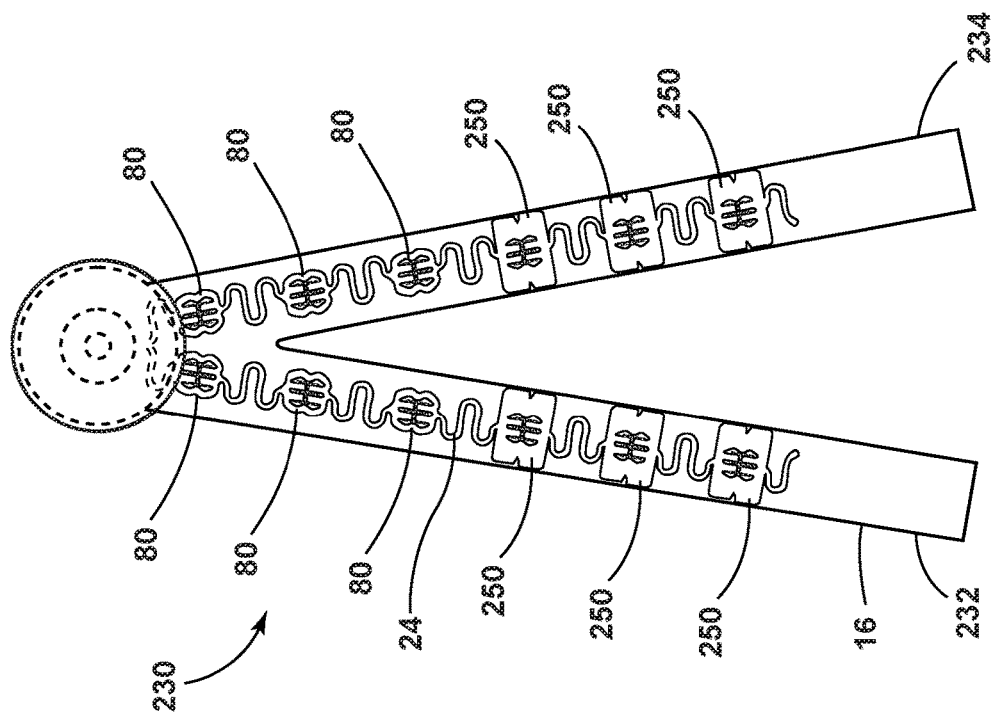
FIG. 26 is a front plan view of the seatback tape assembly of an aspect of the present disclosure.

FIGS. 22 and 23 show the first seatback tape 232 and the second seatback tape 234. Seatback hub 240 is at the junction of the first ends 74 of the first seatback tape 232 and the second seatback tape 234.

With reference to FIGS. 24-28, an alternate aspect of the seat tape assembly 200 and the seatback tape assembly 230 is shown. A tape 16 uses upper conductor 24 that has an increased surface area at the node 250. Nodes 250 have larger upper conductor 24 surface areas to provide increased heat transfer surface areas for occupant cooling and heating. Nodes 250 achieve greater occupant cooling and heating than nodes 80.

Figure 28:
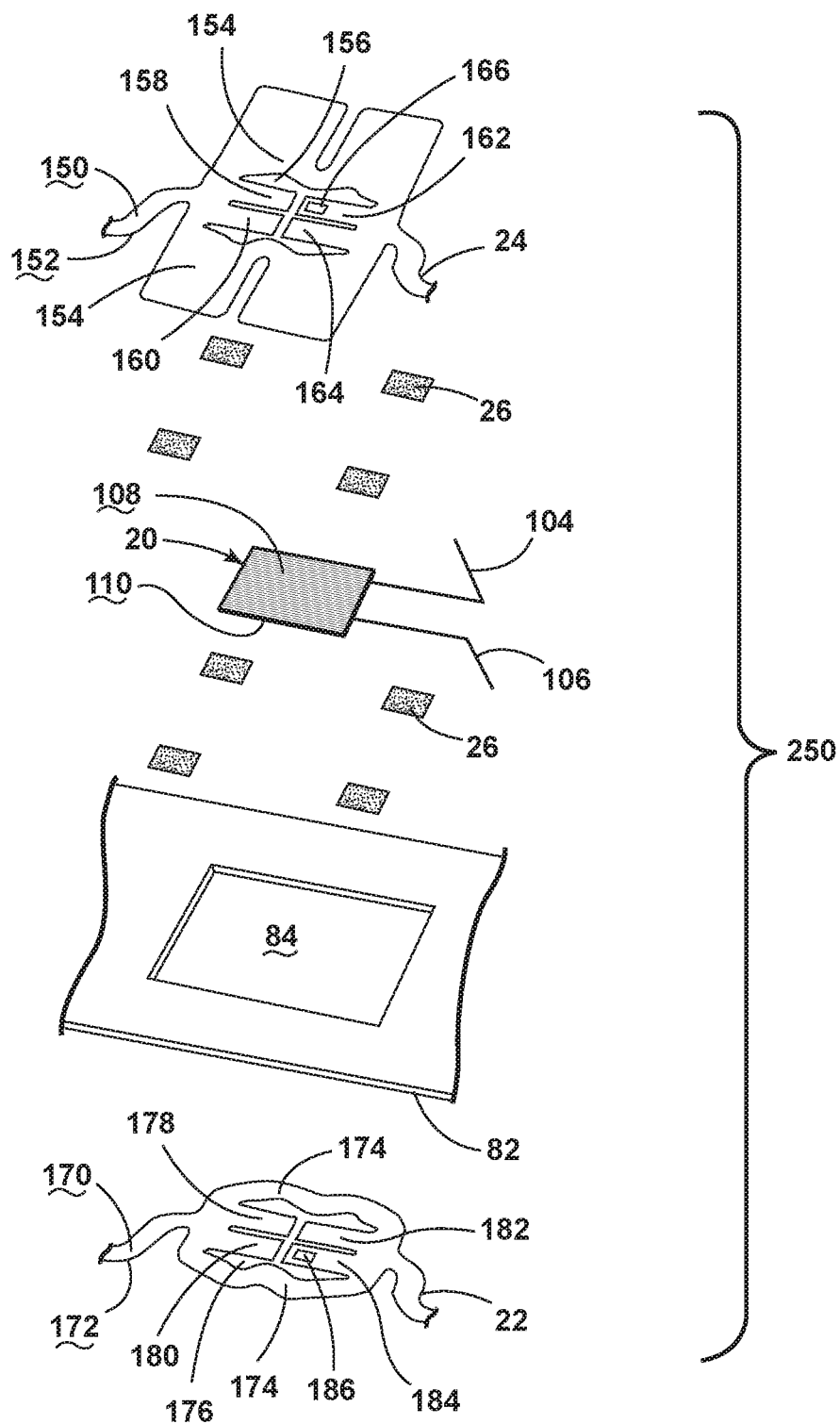
FIG. 28 is an exploded perspective view of an aspect of a node of the tape for a vehicle seating assembly of an aspect of the present disclosure.

FIG. 28 is an exploded view of the node 250 of FIGS. 24-27. The node 250 is configured similarly to the node 80 in FIG. 9. The node 250 upper conductor 24 surface area in FIG. 28 is larger than the node 80 upper conductor 24 surface area in FIG. 9. The node 250 lower conductor 22 surface area is the same as the node 80 lower conductor 22 surface area. In various aspects, the width of carrier 82 is increased so that the size of the upper conductor 24 surface area at node 250 is also increased.

Figure 30:
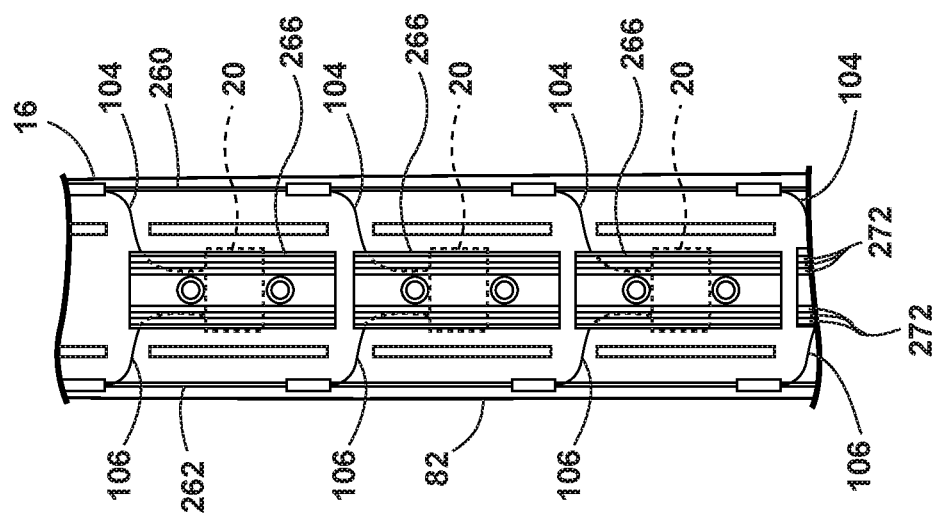
FIG. 30 is a bottom plan view of a tape section of an aspect of the present disclosure.
Figure 29:
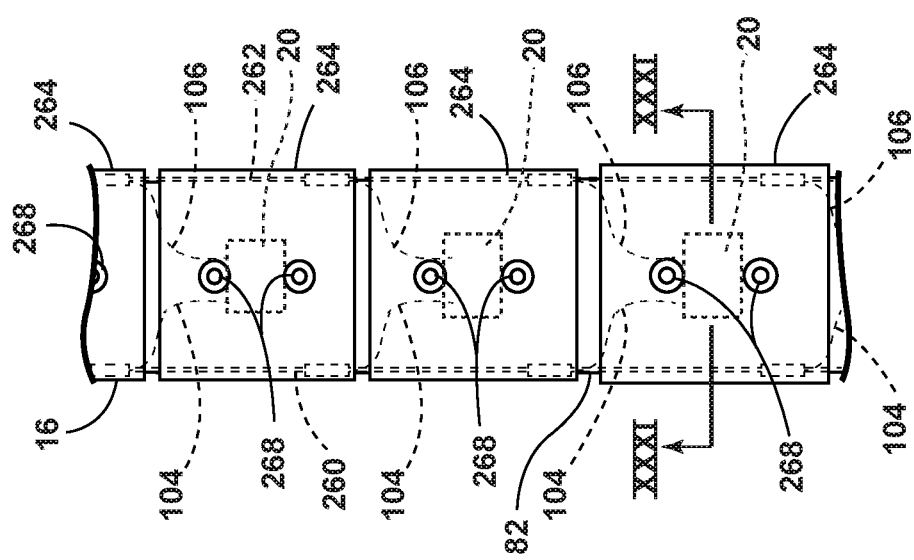
FIG. 29 is a top plan view of a tape section of an aspect of the present disclosure.
Figure 31:
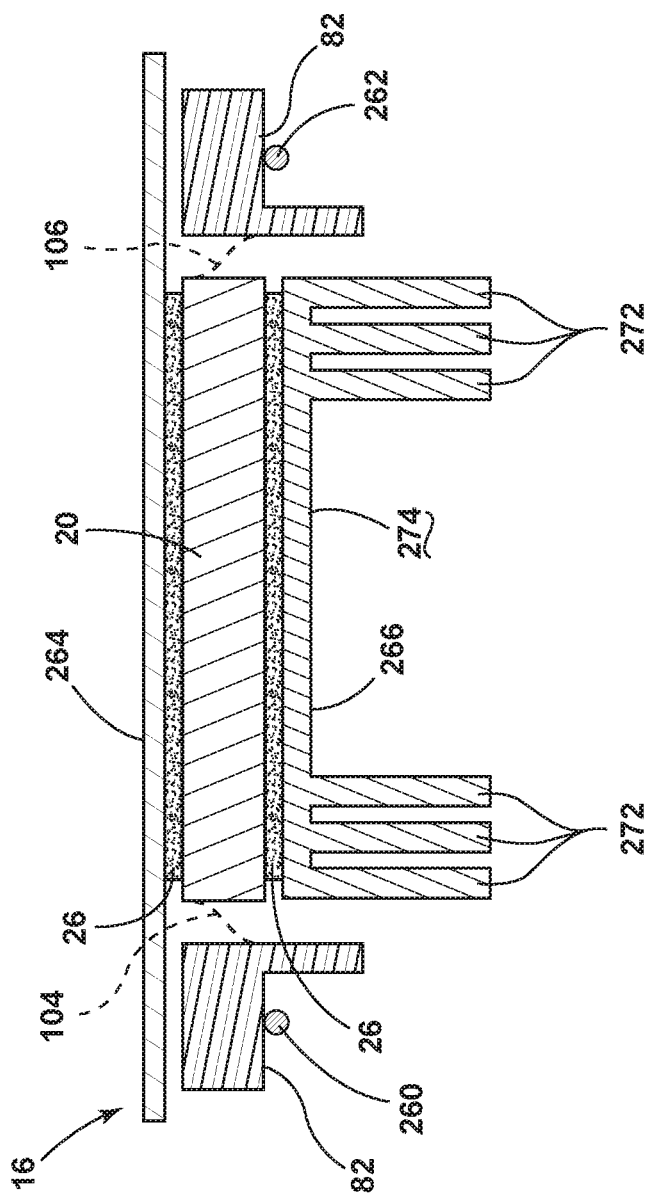
FIG. 31 is a cross-sectional view of the tape of FIG. 29, taken along line XXXI-XXXI.

Another aspect of the disclosure is shown in FIGS. 29-31. The thermoelectric devices 20 are powered by first power source 260 and second power source 262 that run proximate the thermoelectric devices 20 along the length of the tape 16. FIG. 29 shows the tape 16 with the upper thermal conductors 264 attached to the carrier 82 with fasteners 268. The fasteners 268 may be rivets, pins, screws, or any other fasteners. FIG. 30 is a bottom view of the tape 16 of FIG. 29 with lower thermal conductors 266. The lower thermal conductors 266 include fins 272 that extend perpendicularly from lower thermal conductor 266 lower surface 274 for increased lower thermal conductor 266 heat transfer surface area. The first power source 260 and the second power source 262 may be coupled to the vehicle wiring harness at hub 18.

FIG. 31 shows the lower thermal conductor 266 fins 272 that provide an increased heat transfer surface area. In certain aspects, tape 16 may include upper thermal conductors 264 and lower thermal conductors 266. In this aspect, first power source 260 and second power source 262 run along the carrier 82 to provide power to thermoelectric device 20 first wire 104 and second wire 106. The general effect of the aspects of FIGS. 29-31 is the same as that of the aspects of FIGS. 1-28, to absorb or reject heat to cool or heat an occupant.

In various aspects of the present disclosure, the tapes 16 may have upper conductors 24, lower conductors 22, upper thermal conductors 264, and lower thermal conductors 266 in various shapes and surface areas as they relate to one another to provide the occupant with the cooling and heating to meet the needs of the human body in the targeted region of the thighs, buttocks, and/or back. The size, shape, and location of the thermoelectric device nodes 80 may be modified to provide for targeted occupant cooling and heating. Furthermore, the location and size of the tapes 16 in the seat tape assembly 200 and the location and size of the tapes 16 in the seatback tape assembly 230 may be modified to provide targeted occupant cooling and heating. In various aspects, the tape 16 may be used without a hub. For example, the tape 16 may span the length or width of the seat 40 and/or the seatback 42 with access to ambient air at the tape 16 first end 74 and/or second end 76 at seating surface edges 78.

In various aspects, the seat tape assembly 200 and the seatback tape assembly 230 may be placed in the vehicle seating assembly 10 where the human body has its greatest cooling and heating sensitivity. The sensitivity might be where the main arteries of the legs and the largest muscle groups of the legs are located and where the main arteries of the back and the largest muscle groups of the back are located.

In various aspects, the seat tape assembly 200 and the seatback tape assembly 230 cool or heat the occupant by conduction directly through the seat trim 54 and the seatback trim 48. In various aspects, the seat tape assembly 200 and the seatback tape assembly 230 cool or heat the occupant only where the occupant contacts the seat 40 and/or the seatback 42. In various aspects, the tapes 16 of the seat tape assembly 200 and the tapes 16 of the seatback tape assembly 230 are self-ventilating and need no air channels 96. In various aspects, the seat trim 54 and the seatback trim 48 are non-ventilated. The non-ventilated seat trim 54 and seatback trim 48 minimize occupant sweat odors that may accrue over time in ventilated seats. In various aspects, the seat tape assembly 200 and the seatback tape assembly 230 cool or heat an occupant quickly. In various aspects, the vehicle seating assembly 10 has thermostatic regulation. In various aspects, the vehicle seating assembly 10 is effective in the human comfort range between 20-37 degrees Celsius. In various aspects, the vehicle seating assembly 10 is flexible under point loading.

In various aspects, the thermoelectric devices 20 may be various shapes and sizes to accommodate various design parameters of the various aspects of the vehicle seating assembly 10. In various aspects, the thermoelectric device 20 upper surface 108 and lower surface 110 may be made of ceramics or other materials.

In various aspects, the thermoelectric devices 20 in the seat tape assembly 200 and the seatback tape assembly 230 work in unison to cool or heat the occupant. In various aspects, the temperature control system 70 may activate only the thermoelectric devices 20 in the seat tape assembly 200, only the thermoelectric devices 20 in the seatback tape assembly 230, or the thermoelectric devices 20 in both the seat tape assembly 200 and the seatback tape assembly 230.

It is to be understood that use of the seat 40 airflows 140 and the seatback 42 airflows 140 in various aspects may be modified to enhance the cooling or heating of the occupant. In various aspects, the seat tape assembly 200 and/or the seatback tape assembly 230 may increase the efficiencies of the heat transfer elements by employing more conductive heat transfer materials for increased heat transfer.

In another aspect, any of a wide variety of heat sinks known to those of skill in the art may be used in place of or in combination with the upper conductor 24 and the lower conductor 22, the upper thermal conductor 264, and the lower thermal conductor 266.

In another aspect, solid state heat pumps using a thermoelectric effect may be used in place of the thermoelectric devices 20. A two-directional heat pump may use ambient air applied to its lower surface to heat or cool its upper surface.

In another aspect, the seat cushion 12 and the seatback cushion 72 may be replaced by a different type of seating known to those skilled in the art.

A variety of advantages may be derived from the use of the present disclosure. An occupant is able to control the cooling or heating of the seat 40 and the seatback 42. The cooling and heating systems may be integrated into the temperature control system 70. The cooling and heating systems may include sensors that sense occupant temperature and automatically adjust vehicle seating assembly 10 temperature to a desired setting and/or in response to the ambient air temperature in the vehicle. The seat tape assembly 200 and the seatback tape assembly 230 may offer fast cooling and fast heating. The seat tape assembly 200 and the seatback tape assembly 230 are flexible under point loading. The seat tape assembly 200 and the seatback tape assembly 230 may be lay-in-place devices. The seat tape assembly 200 and the seatback tape assembly 230 may be modular. The seat tape assembly 200 and the seatback tape assembly 230 may be used with a standard seating assembly. The thermally conductive tape 16, may be cut to a desired length.

It will be understood by one having ordinary skill in the art that construction of the described disclosure, and other components, is not limited to any specific material. Other exemplary aspects of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

It is also important to note that the construction and arrangement of the elements of the disclosure, as shown in the exemplary aspects, is illustrative only. Although only a few aspects of the present innovations have been described in detail in this disclosure, those skilled in the art who review this disclosure will readily appreciate that many modifications are possible (e.g., variations in sizes, dimensions, structures, shapes, and proportions of the various elements values of parameters, mounting arrangements, use of materials, colors, orientations, etc.) without materially departing from the novel teachings and advantages of the subject matter recited. For example, elements shown as integrally formed, the operation of the interfaces may be reversed or otherwise varied, the length or width of the structures and/or members or connector to other elements of the system may be varied, and the nature or numeral of adjustment positions provided between the element may be varied. It should be noted that the elements, and/or assemblies of the system may be constructed from any of the wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary aspects without departing from the spirit of the present innovations.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and, further, it is to be understood that such concepts are intended to be covered by the following claims, unless these claims, by their language, expressly state otherwise. Further, the claims as set forth below, are incorporated into and constitute part of this Detailed Description.

What is claimed is:

1. A vehicle seating assembly comprising:
a cushion and a seating surface;
a recess including at least two branches defined in the cushion, the at least two branches coming together at a junction and extending in a direction parallel with the seating surface;
an elongate carrier disposed between the recess and the seating surface, the elongate carrier including a plurality of thermoelectric devices arranged along the recess; and
a flexible bellows extending through the cushion and having a first end in fluid communication with the junction and a second end in fluid communication with an air mover wherein the at least two branches include two forwardly-extending branches and two rearwardly-extending branches.

2. The vehicle seating assembly of claim 1, wherein the recess includes a film disposed therein.

3. A vehicle seating assembly comprising:
a cushion and a seating surface;
a recess including at least two branches defined in the cushion, the at least two branches coming together at a junction and extending in a direction parallel with the seating surface;
an elongated carrier disposed between the recess and the seating surface, the elongate carrier including a plurality of thermoelectric devices arranged along the recess; and
a flexible bellows extending through the cushion and having a first end in fluid communication with the junction and a second end in fluid communication with an air mover, wherein the recess has a first end and a second end the first end being coupled to the bellows and the second end being located at an edge of the cushion and being in communication with ambient air.

4. A seating assembly comprising:
a seat including a cushion and a seating surface;
a recess defined in the seat and extending in a direction parallel with the seating surface;
a conductive elongate tape disposed between the recess and the seating surface; and
a bellows extending through the cushion and having a first end in fluid communication with the recess and a second end in fluid communication with an air mover.

5. The seating assembly of claim 4, wherein a voltage is applied to the conductive tape to cool or heat the seating surface.

6. The seating assembly of claim 5, wherein air in the recess carries heat away from or toward the conductive tape.

7. The seating assembly of claim 4, further comprising:
a film disposed in the recess.

* * * * *